(12) United States Patent
Oren et al.

(10) Patent No.: US 12,359,968 B2
(45) Date of Patent: Jul. 15, 2025

(54) SYSTEMS AND METHODS FOR OPTICAL METROLOGY

(71) Applicant: NOVA LTD., Rehovot (IL)

(72) Inventors: Yonatan Oren, Kiryat Ono (IL); Eyal Hollander, Ramat Hasharon (IL); Elad Schleifer, Rehovot (IL); Gilad Barak, Rehovot (IL)

(73) Assignee: NOVA LTD., Rehovot (IL)

( * ) Notice: Subject to any disclaimer, the term of this patent is extended or adjusted under 35 U.S.C. 154(b) by 175 days.

(21) Appl. No.: 18/003,801

(22) PCT Filed: Jul. 5, 2021

(86) PCT No.: PCT/IL2021/050824
§ 371 (c)(1),
(2) Date: Dec. 29, 2022

(87) PCT Pub. No.: WO2022/009197
PCT Pub. Date: Jan. 13, 2022

(65) Prior Publication Data
US 2023/0296436 A1    Sep. 21, 2023

Related U.S. Application Data

(60) Provisional application No. 63/048,137, filed on Jul. 5, 2020.

(51) Int. Cl.
*G01J 3/10* (2006.01)
*G01J 3/02* (2006.01)
(Continued)

(52) U.S. Cl.
CPC ............... *G01J 3/10* (2013.01); *G01J 3/0208* (2013.01); *G01J 3/0248* (2013.01);
(Continued)

(58) Field of Classification Search
CPC ...... G01J 3/0208; G01J 3/0248; G01J 3/0289; G01J 3/0291; G01J 3/10; G01J 3/18;
(Continued)

(56) References Cited

U.S. PATENT DOCUMENTS

2011/0278472 A1*  11/2011  Atzler ................... G01J 3/0202
                                                       250/459.1
2018/0180478 A1     6/2018  Goldring et al.
(Continued)

OTHER PUBLICATIONS

Paudel et al.. "Ultra-high resolution and broadband chip-scale speckle enhanced 31Fourier-transform spectrometer" . . . Apr. 29, 2020; Optical Society of America; Publication[online]. [retrieved Aug. 23, 2021]. Retrieved from the Internet: ; pp. 1-17.

*Primary Examiner* — Hina F Ayub
(74) *Attorney, Agent, or Firm* — Reches Patents

(57) ABSTRACT

Systems and methods for metrology of workpieces such as wafers, using spectrometry of multi-spot-arrays formed over a test area of the tester workpiece, for optically measuring characteristics of the tested workpiece, where the optical metrology system is configured such that the distribution of energy density or flux of the multi-spot-array over the test area of the tested workpiece is such that prevents affecting the workpiece during its testing.

14 Claims, 12 Drawing Sheets

(51) Int. Cl.
*G01J 3/18* (2006.01)
*G01J 3/28* (2006.01)
*G01J 3/44* (2006.01)

(52) U.S. Cl.
CPC ............... *G01J 3/0291* (2013.01); *G01J 3/18* (2013.01); *G01J 3/2803* (2013.01); *G01J 3/44* (2013.01)

(58) Field of Classification Search
CPC ........ G01J 3/2803; G01J 3/44; G01N 21/253; G01N 21/65; G01N 2201/0635; H01L 22/12; H01L 22/20; H01L 22/34
See application file for complete search history.

(56) References Cited

U.S. PATENT DOCUMENTS

| | | | |
|---|---|---|---|
| 2020/0041410 A1 | 2/2020 | Ashrafi | |
| 2020/0225151 A1* | 7/2020 | Wang | G01N 21/3563 |
| 2020/0363564 A1* | 11/2020 | Tsur | G02B 3/0062 |

* cited by examiner

| Holding each workpiece to be tested at a specific required measuring-position | 61 |

↓

| Forming a multi-spot-array, from light emanating from at least one light source, e.g., wherein the multi-spot array is formed over a test area of the tested workpiece, using at least one optical element; | 62 |

↓

| Detecting spectral characteristics of one or more spots of the multi-spot-array | 63 |

↓

| Determining one or more properties of the tested area of the tested workpiece, based on determined spectral characteristics of the one or more spots of the multi-spots-array | 64 |

Fig. 14

SYSTEMS AND METHODS FOR OPTICAL METROLOGY

CROSS REFERENCE TO RELATED APPLICATIONS

This PCT application claims benefit of U.S. (United States) provisional patent application No.: 63/048,137 filed Jul. 5, 2020, which is incorporated herein by reference in its entirety.

FIELD OF THE INVENTION

The present disclosure relates in general to optical metrology, and more particularly to spectroscopy-based metrology.

BACKGROUND

Optical metrology or inspection is often used in semiconductor production processes for detection of quality related characteristics of mass manufactured workpieces (such as workpieces used for the semiconductors industry). In some cases, spectrometry is used for scanning of one or more areas over each tested workpiece for quality inspection thereof.

Typically, in order to achieve reliable measurement results, with high signal to noise ratio (SNR), the required energy flux/distribution that should be used and projected over the surface of each tested workpiece, is quite high and can damage the workpiece being tested e.g., due to overheating of the irradiated area of the surface of the tested workpiece. Using low energy flux, on the other hand, to avoid damaging the tested workpiece, typically requires long acquisition time spans per each workpiece to be measured and may still not be reliable enough. This issue renders these optical metrology methods unreliable and/or ineffective for largescale industrial workpieces' inspection, which requires fast, accurate, damage-free and effective quality characteristics detection.

BRIEF DESCRIPTION OF THE FIGURES

The figures illustrate generally, by way of example, but not by way of limitation, various embodiments discussed in the present document.

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. References to previously presented elements are implied without necessarily further citing the drawing or description in which they appear. The figures are listed below.

FIG. 1A shows a schematic illustration of the system layout; and FIG. 1B shows a schematic illustration of main components of a spectrometer of the system;

FIG. 2A shows a schematic illustration of part of the system layout; and FIG. 2B shows a schematic illustration of main components of a spectrometer of the system;

FIG. 3A shows a schematic illustration of the system layout; and FIG. 3B shows a schematic illustration of main components of a spectrometer of the system, inter alia, for Raman spectroscopy based workpieces' metrology;

FIG. 4A shows a single lenslet array design; and FIG. 4B shows a dual lenslet array design;

FIG. 5A shows a multi-spot-array formed by using a single lenslet array, similar to the one illustrated in FIG. 4A; FIG. 5B shows a multi-spot-array formed by using dual lenslet array, similar to the one illustrated in FIG. 4B; and FIG. 5C shows the intensity distribution differences of the multi-spot-array formed when using the single and the dual lenslet array configurations;

FIG. 14 shows a flowchart, illustrating a process for spectral metrology of workpieces, according to some embodiments.

DETAILED DESCRIPTION

Figure 1A:
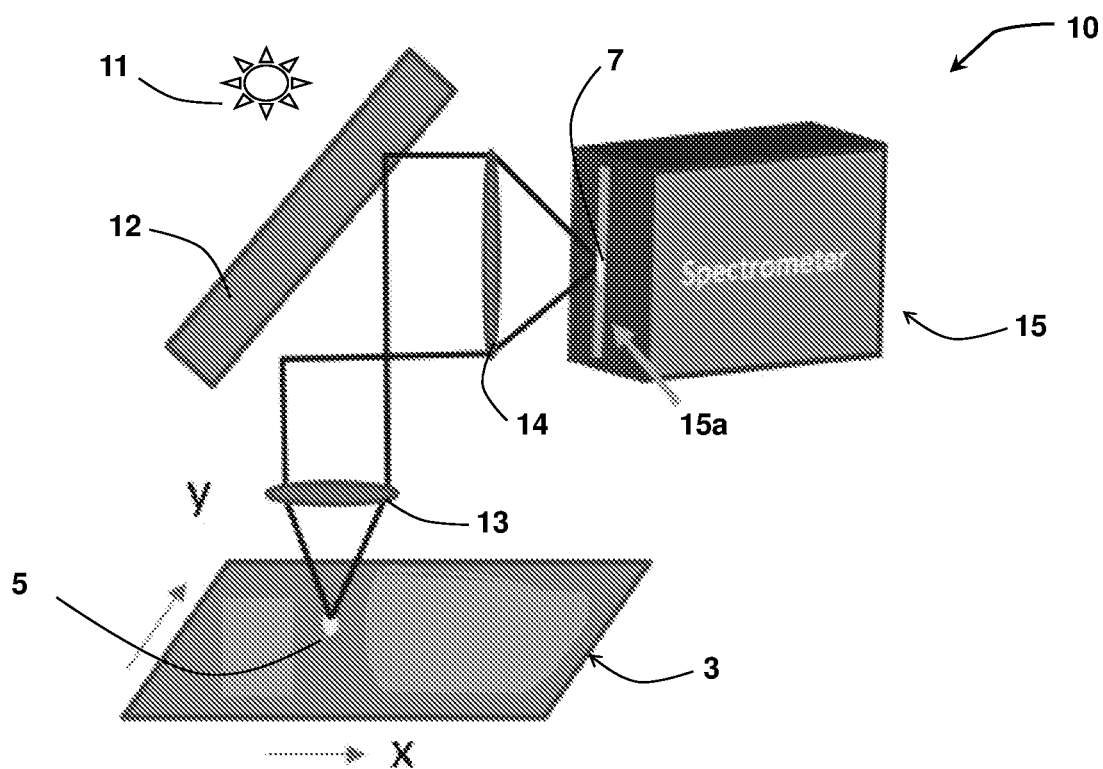
FIGS. 1A and 1B show main parts of a metrology system for spectral detection workpieces, using a single-spot illumination.

According to some embodiments, a single-frequency light source can be used (such as single-frequency laser, focused or collimated via a focusing/collimation lens), for optical meteorology of workpieces, providing a high power source required for optimal signal to noise ratio (SNR), along with high spatial resolution reaching few hundred nanometers (nm).

Using a single focused laser spot can have detrimental effects over the workpiece being tested, inducing a variety of damages. Such effects may include, for example, changes in crystallinity, matter-phase changes (e.g., melting, fusing of layers, etc.), texture changes, structural damages etc. resulting from photochemical effects and/or thermal heating, for example. The damaging effects to the workpiece being measured may occur due to concentration/focusing of the light energy (high flux) over an extremely small test area (e.g., of a few millimeters or less) over the tested element for achieving a sufficient SNR and spatial resolution within a reasonable inspection-time per each tested workpiece.

To avoid damaging workpieces being tested, the laser light source' output power/intensity may simply be reduced. Such approach, however, may dramatically increase the required acquisition time per tested workpiece, for achieving a reliable quality measurement, which may not be enabled in systems requiring fast inspection of large batches of mass produced workpieces.

Aspects of disclosed embodiments pertain to systems and methods for optical metrology for optical (spectral) detection of physical characteristics of workpieces e.g., for quality characterization thereof, using Raman spectroscopy.

Raman spectroscopy is a technique that can be used for detecting molecular characteristics of workpieces and typically requires using a monochromatic light source, e.g. using a single-frequency laser. The laser light interacts with molecular vibrations of the workpiece being measured, causing the energy of the laser photons to perform a spectral shift in respect to output wavelength of the light source being used. The spectral shifts are caused due to inelastic scattering of photons. These spectral shifts enable detection of molecular and optionally also other physical characteristics of the workpiece/material being tested. Some techniques for using Raman spectroscopy for measuring patterned-structured samples are described in U.S. Pat. No. 10,564, 106B2, which is incorporated herein by reference, in its entirety.

According to some embodiments, the metrology systems and methods of disclosed embodiments, include irradiating of at least one test area of each tested workpiece such as to form thereover at least one multi-spots array, each array having a non-damaging energy density (intensity distribution/flux), where the light spots of the multi-spot-array(s) are arranged in a known arrangement or pattern, for spectral detection and analysis of characteristics of the light reflected, scattered, and/or photo-illuminated (via photoluminescence) from those light spots over the test area of the tested workpiece.

The term "workpiece" used herein may refer to or include any type of material, element, object, specimen, sample, component, piece, chip, etc. for optical inspection such as, yet not limited to: a sample of any solid material, a wafer, a semiconductor device/piece, an integrated circuit, an electronic board, a photovoltaic (PV) cell or element containing PV cells, and the like.

According to some embodiments, the intensity/energy distribution of the light irradiating and impinging the test area of each tested workpiece, may be manipulated by enlarging the overall surface-space of irradiation emanating from a light source outputting light of high energy density, into a larger light spot or into multiple light spots of a much lower energy-density per spot, for optimizing measurement reliability and resolution and preventing damaging of the workpiece being tested. Spectral characteristics of the light spots can be optically measured by using a spectrometry-based metrology system e.g., configured for Raman spectroscopy.

Aspects of disclosed embodiments pertain to using Raman, photoluminescence and/or photoreflectance spectroscopy techniques for optical metrology of workpieces for measuring and determining one or more properties of the tested workpieces or parts thereof e.g., for quick qualitative and efficient identification of workpieces' impairments in workpieces mass production environments.

It is noted that terms such as "system" and "metrology system" may be used interchangeably herein.

For Raman spectroscopy based optical metrology of workpieces, one or more spectrometry devices can be used such as a spectrometer having one or more input apertures for receiving light therethrough, of specific size.

In order to reduce energy density (flux) over the test area, while using high-power light source(s), the size of a spot formed over the tested workpiece can be simply enlarged. However, in addition to the loss of spatial resolution and required increased acquisition time, once the illuminated enlarged spot is imaged onto the optical detector (e.g., the spectrometer), the majority of the signal may be cut by the aperture of the spectrometer being used.

One mitigation technique, according to some embodiments, may be using an elongated spot ('line-spot' or 'elliptic spot') which is then passed through a narrow aperture (slit) of the spectrometer. This may reduce power/energy density thereby prevent damaging of the tested workpiece and enable a more efficient use of the illuminated power. In the extended direction, the spot can be—in principle—highly elongated providing significant reduction of power density, while still enabling image of the elongated spot to be fully received by the spectrometer aperture. However, for some particular implementations, this technique may not be sufficient enough to avoid damaging of the tested workpieces, as the elongated spot may still cause overheating of the tested area of the workpiece and not provide a sufficient and fast enough heat dissipation over the test area, depending on the required size of the test area, which limits the maximal size of the elongated spot. For example, for spectral metrology of semiconductor workpieces, the measured region must be limited to few tens of microns at most. This restriction limits the spots size (which must be smaller than the size of the test area, and therefore limits the maximal spot surface/length of the elongated-spot.

Another technique disclosed in embodiments of the present invention, also briefly mentioned above, pertains to using several light spots ("sub-spots") divided from a single light source thereby splitting the source's energy density into several spots of reduced flux. This technique may further include performing spectral (Raman) measuring and analysis of the multiple spots formed over the test area for workpiece metrology. Using multiple spots allows a much more efficient heat dissipation over the workpiece's surface area, since each spot is surrounded by a non-irradiated cooler periphery allowing quicker heat dissipation and therefore increased damage-prevention. The division of the output light into several sub-spots also enables better spatial resolution for the spectral (Raman-spectroscopy-based) measurements, since the different spots' spectral characteristics being measured can be compared to one another as well as optionally to a known model of the spectral characteristics of these spots for the specific workpiece's type and also provide a better spatial resolution for detecting the exact location of identified impairments—since the actual irradiation is segmented.

Aspects of disclosed embodiments, pertain to a spectral metrology system for optical measuring of characteristics of workpieces, including at least:
- an illumination subsystem comprising at least one light source;
- a workpiece handling subsystem configured at least for holding each tested workpiece to be measured at a specific required measuring-position;
- an optical subsystem configured and located to form at least one multi-spot-array, from light emanating from the at least one light source, wherein the at least one multi-spot-array has multiple light spots, over a test area of the tested workpiece, wherein the distribution of energy density or flux of the at least one multi-spot-array over the test area of the tested workpiece is such that prevents affecting the test area during its measuring;
- at least one spectrometry device having at least one aperture, positioned at a specific relative-position in respect to the test area of the tested workpiece, wherein the optical subsystem is further positioned and configured to form a spots-image of the multi-spot-array, over the at least one aperture of the spectrometry device, for detecting spectral characteristics of each spot of the spots-image, emanating from the test area of the tested workpiece;
- at least one processing and control unit (PCU), configured to receive spectral output data from the at least one spectrometry device to determine spectral characteristics of each spot of the spots-image, and determine one or more properties of the tested area of the tested workpiece, based on determined spectral characteristics of the spots-image, According to some embodiments, the spectrometry device may include a spectrometer.

Aspects of disclosed embodiments, pertain to a method for measuring characteristics of workpieces, the method including at least:
- providing a metrology system comprising at least one spectrometry device having at least one aperture;
- holding each workpiece to be tested at a specific required measuring-position in relation to at least one light source illumination direction and the at least one aperture of the at least one spectrometry device;
- forming at least one multi-spot-array over a test area of the tested workpiece, from light emanating from the at least one light source, using at least one optical elements;
- forming a spots-image of the multi-spot-array over the at least one aperture of the at least one spectrometry device;
- detecting spectral characteristics of each spot of the spots-image, emanating from the test area of the tested workpiece; and
- determining one or more properties of the tested area of the tested workpiece, based on determined spectral characteristics of the spots-image.

Figure 1B:
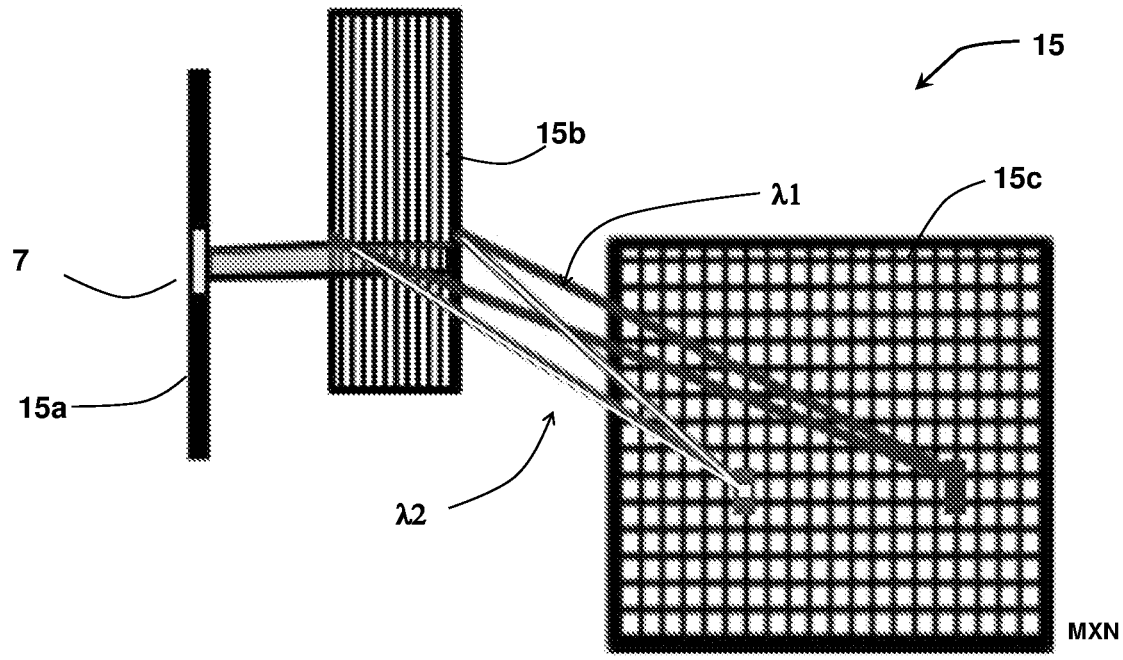

Reference is now made to FIGS. 1A and 1B showing main parts of a system 10 for spectral detection based metrology (using Raman spectroscopy) of an workpiece such as a semiconductor wafer 3, using a single circular light spot 5 formed over the wafer workpiece 3 by using one or more optical elements for forming the single circular (dot) spot 5 over the wafer 3 (e.g., by using a single-frequency laser light source 11 directed towards the upper side of the wafer 3 via a beam splitter 12 and a focusing lens 13, where an image of the single circular spot 5 (herein "spot image" 7) is formed over an aperture 15a of a spectrometer 15 e.g., by using an objective lens 14, for detection of spectral characteristics of the spot-image ultimately for determining quality related properties of the wafer, based on the measured/determined spectral characteristics of the spot-image.

FIG. 1B shows a specific spectrometer 15 design for Raman spectroscopy, according to some embodiments. The Spectrometer 15 may include:
- one or more apertures such as aperture 15a;
- a diffraction grating element 15b having an input surface thereof (not shown) facing the aperture 15a; and
- a pixelated optical detector 15c such as a charged coupling device (CCD), a RGB/RGBY camera, an active pixel sensor (APS), etc.

According to some embodiments, as shown in FIGS. 1A-1B, a single-frequency laser source 11 illuminates a wafer workpiece 3 via a collimator or a focusing lens 13 forming a dot spot 5 over the wafer workpiece 3. The induced signal from this spot 5 is imaged onto the input surface of the diffraction grating element 15b of the spectrometer 15 via the spectrometer aperture 15a, forming thereover a "spot image" 7 In the spectrometer 15: the diffraction grating element 15b separates different wavelengths of the spot image 7 where the diffracted light exiting the diffraction grating element 15b is directed towards the pixelated optical detector 15c which is located and configured to detect spectral characteristics of the spot-image 7 such that the respective spot-image spectrum is represented over a specific row/column of pixels over the detector 15c (as seen in this case: a single spot image 7 spectral characteristics (spectrum) is shown by pixels over row 6 of a CCD pixelated optical detector 15c.

The spectral bandwidth of the spot 5 and therefore of the spot-image 7 may be much wider than that of the light source 11 being used, due to photoluminescence, photoreflectance and/or scattering such as Raman scattering caused to the light impinging the surface of the tested workpiece 3.

Figure 2A:
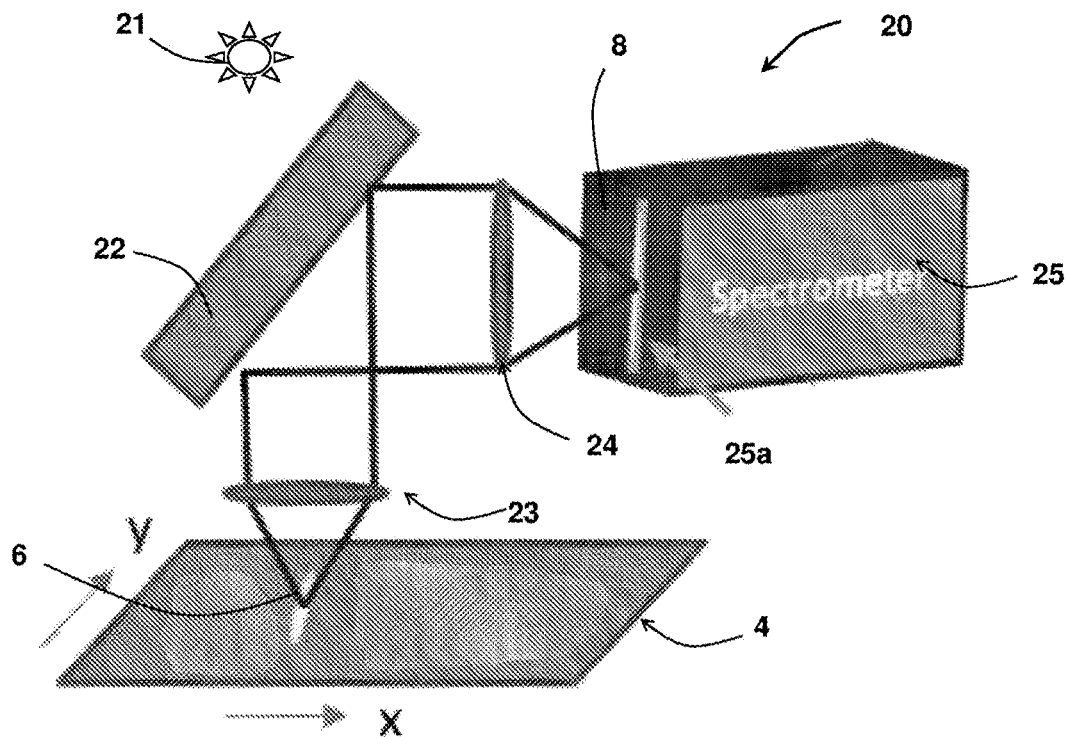
FIGS. 2A and 2B show main parts of a metrology system for spectral detection of workpieces, using a single elongated (elliptic) spot, according to some embodiments.
Figure 2B:
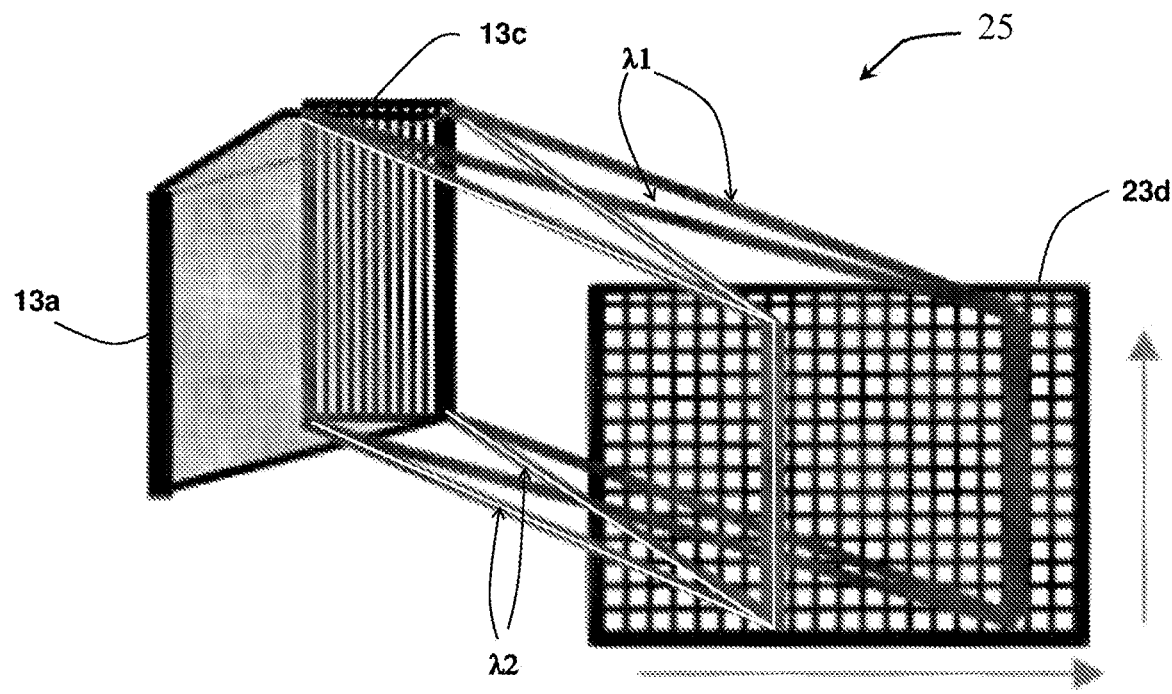

Reference is now made to FIGS. 2A and 2B show main parts of a system 20 for optical (spectral) metrology of workpieces such as wafer workpiece 4, using a single elongated (line/elliptic) spot 6, formed over the wafer workpiece 4 by using one or more optical elements for forming the elongated spot 6 over the wafer 4 (e.g., by using a single-frequency laser light source 21 directed towards the upper side of the wafer 4 via a beam splitter 22 and a focusing lens 23. An image of the single elongated spot 6 (herein "spot image" 8) is projected onto an aperture 25 a of a spectrometer 25 for detection of spectral characteristics of the spot-image ultimately for determining quality related properties of the wafer, based on the measured/determined spectral characteristics of the spot-image. To form the spot image 8, one or more optical elements such as focusing lens 23 may be used located such as to form an elongated spot 6 over the workpiece 4 and reflected/deflected from beam splitter 22

FIG. 2B shows a specific spectrometer 25 design for Raman spectroscopy, according to some embodiments. The Spectrometer 25 may include:
- one or more elongated apertures such as elongated aperture 25a (slit);
- a diffraction grating element 13c having an input surface thereof (not shown) facing the elongated aperture 25 a; and a pixelated optical detector 23*d* such as CCD, a RGB/RGBY camera, an active pixel sensor (APS), etc.

An image 8 of the elongated spot 6 may be formed over the aperture 25*a* by using one or more optical elements such as objective lens 24.

The elongated spot technique allows reducing spatial energy distribution (flux) of the spot over the surface of the workpiece, thereby avoiding damaging or reducing chances of damaging/affecting the workpiece. The spot image 8 (also elongated in shape) enters the spectrometer's elongated aperture 25 *a* with a much less loss of light in respect to the circular spot technique illustrated in FIGS. 1A-1B, and impinges an input surface of the diffraction grating element 13*c*. Inside the spectrometer 25, different wavelengths are split to different sensor columns (e.g., columns 7-8 for violet/ultraviolet (UV) and 18-19 for red or infrared (IR))of the pixelated optical detector 23*d* over the same rows of pixels (in this case, for instance over pixels rows 1 to 14) thereby enabling spectral analysis of the test area of the workpiece 4, for example for detection of workpiece properties.

Figure 3A:
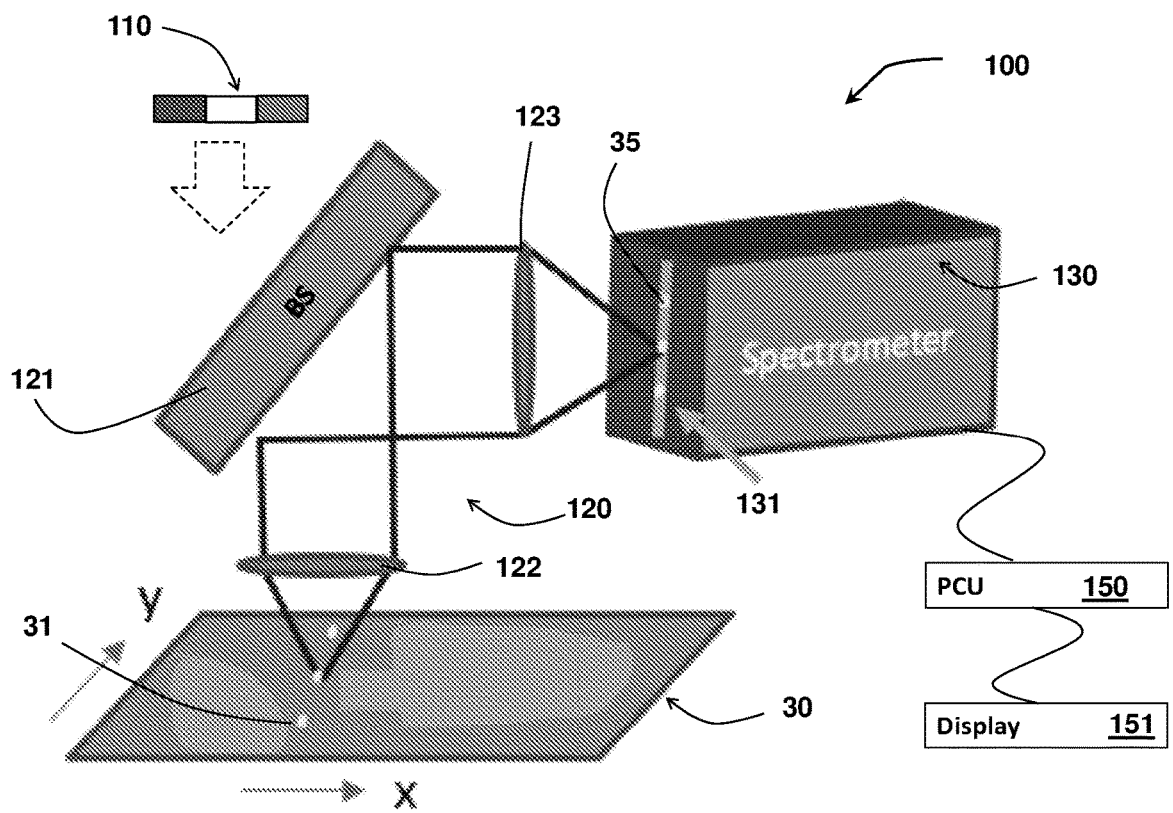
FIGS. 3A and 3B show main parts of a metrology system for spectral detection of workpieces, using an multi-spot-array which is an array of multiple low-flux light spots, according to some embodiments.
Figure 3B:
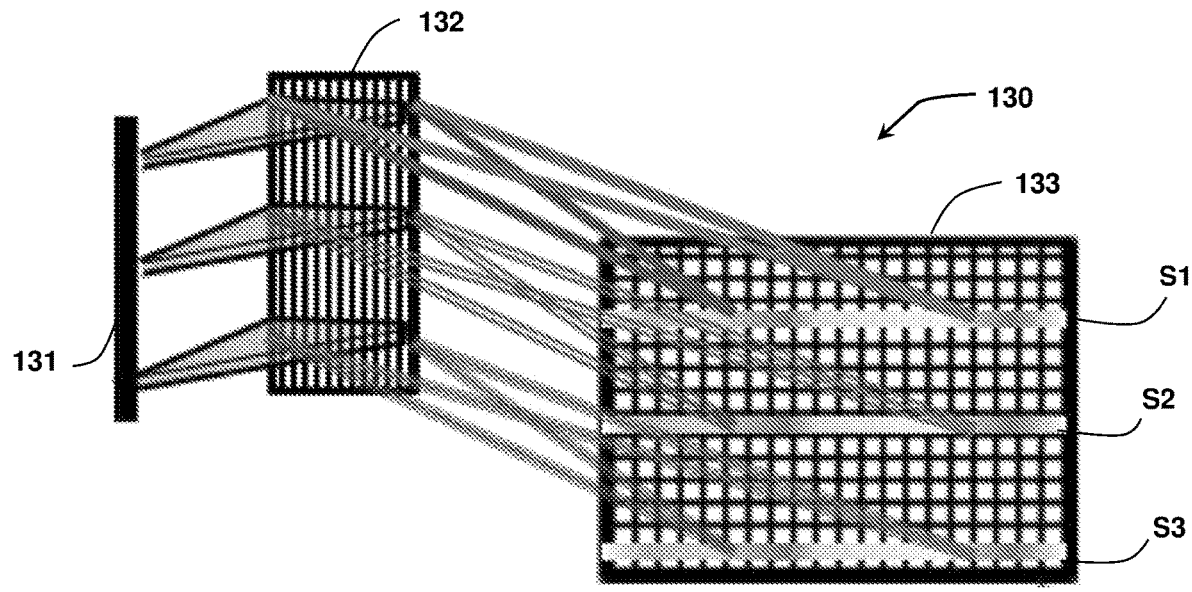

Reference is now made to FIGS. 3A-3B, schematically illustrating main parts of a metrology system 100 for measuring physical characteristics of workpieces, according to some embodiments, using one or more multi-spot-arrays imaging for improved (Raman) spectroscopy-based measuring of workpiece' characteristics.

The metrology system 100 may include at least:
- an illumination subsystem 110 comprising one or more light sources such as three switchably operated and selectable single-frequency lasers outputting light at three different wavelengths in any one or more of the infrared (IR), near IR (NIR), ultraviolet (UV) near UV (NUV) and VIS bands, each outputting light of a narrow wavelength band of between 0-2 picometers (pm) of a different wavelength λ1/λ2/λ3, the illumination subsystem 110 may further include means for selecting, per each measurement of the same workpiece 30, a different light source, and switching therebetween according to requirements (such that for each the test area is scanned for each of the available light sources and wavelengths);
- an optical subsystem 120 configured and located to form at least one multi-spot-array 31 over a test area of a tested workpiece 30, e.g., by splitting a monochromatic light emanating from the at least one light source of the illumination subsystem 110, into several sub-spots forming thereby a multi-spot-array 31 that has multiple light spots aligned in a row, over the test area of the tested workpiece 30;
- at least one spectrometry device such as a spectrometer 130 having at least one elongated aperture 131, positioned at a specific relative-position in respect to the test area of the tested workpiece 30, where the optical subsystem 120 is further positioned and configured to form a spots-image 35 of the multi-spot-array, onto the elongated aperture 131 of the spectrometer 130, for detecting spectral characteristics of each spot of the spots-image 35; and
- at least one processing and control unit (PCU) 150, configured to receive spectral output data from the spectrometer 130, analyze the received spectral output data to determine spectral characteristics of each spot of the spots-image 35, and determine properties of the tested area of the tested workpiece, based on determined spectral characteristics of the spots-image 35.

According to some embodiments, the division of the light from the light source, into multiple spots of the multi-spot-array 31 over the test area of the tested workpiece 30 dramatically reduces distribution of energy density over the test area, which may be very small for wafer workpieces (having a test area maximum radius ranging between 0.5-100 microns). This enables reducing or utterly preventing damaging the test area during measuring of its characteristics.

Using multiple spots for Raman spectroscopy-based metrology of workpieces, where the spots are sufficiently spatially separated from one another (in oppose to a spreader/elongated enlarged spot or engaging spots) dramatically improves damage-prevention and accuracy of measurement, since in the multi-spot formation, a larger cooler non-illuminated area surrounds each spot, preventing overheating of the spot as well as allowing quicker cooling of the illuminated spot area (improving heat dissipation of each spot). The improved heat dissipation allows increasing laser power (for improved SNR) while still avoiding damaging the tested workpiece.

According to some embodiments, the optical subsystem 120 may include:
- a first optical setup having one or more optical elements located and configured for forming the one or more multi-spot-array 31 over workpieces' test area e.g., by using a beam splitter 121 and a lenslet array or a diffraction grating mask element 122; and
- a second optical setup including one or more optical elements such as an objective lens 123, configured and located such as to form the spots-image 35 at the aperture 131 of the spectrometer 130.

FIG. 3B shows a specific spectrometer 130 design for Raman spectroscopy, according to some embodiments. The Spectrometer 130 may include:
- one or more elongated apertures such as elongated aperture 131 (slit);
- a diffraction grating element 132 having an input surface thereof facing the elongated aperture 131; and
- a pixelated optical detector 133 such as CCD, a RGB/RGBY camera, an active pixel sensor (APS), etc.

According to some embodiments, the spots-image 35 is formed over the input surface of the diffraction grating element 132 where each spot passed through the diffraction grating element 132 is diffracted/refracted/scattered such as to form a separate spectrum over the pixelated optical detector 133 e.g., where spectrum of each spot is associated with a different row of pixels over the pixelated optical detector 133.

According to some embodiments, the metrology system 100 may be such that the spatial separation between subspots of the spots-image 35 is larger than the width and/or length of a pixel of the pixelated optical detector, for allowing easy separation between the spectrums of each spot—such as for having a few rows separating spectrum pixels cluster-row associated with each spot of the spots-image. FIG. 3B shows, for example, a separation between each spectrum pixels-row S1, S2 and S3 of about four rows of pixels.

According to some embodiments, as shown in FIG. 3A, the PCU 150 may include or be communicatively associated with one or more display devices such as display device 151 for displaying of analysis results for each tested workpiece and other information associated with measurements results, operational information etc.

According to some embodiments, the PCU 150 may also be associated and/or include input means for allowing users to input operational information e.g., by using a graphical user interface (GUI) enabling both information input and display.

The PCU 150 may be configured to enable controlling the system 100 to allow testing various types of workpieces and controlling acquisition parameters, commands, system configuration etc., depending on selected/inputted workpiece type. For example, each workpiece type may be associated with an acquisition protocol including a set of machine-operating commands determining test area position and relative position required between the workpiece test area and other components of the system 100 such as the light source being used, the spectrometer, the optical elements of the system etc. A user may simply be required to enter/select the workpiece type to be tested for all batch of same-type workpieces that should be automatically tested by the metrology system 100 and optionally the number of workpiece samples to be tested from the same batch/type, and the system 100 may automatically operate the corresponding testing program for measuring one or more properties of each of the workpieces in the tested batch.

Workpiece's properties that can be determined/measured may include for example: (i) material properties such as: composition, strain, crystallinity, defects, doping, phase, grain size; (ii) coating layers' thicknesses; (iii) pollutant materials' presence of each workpiece; etc., as well as other properties such as: (a) test area surface topography, (b) optical properties of the workpiece's surface such as reflectivity and/or absorption properties, and the like. The workpiece properties may be ultimately used to determine quality of each tested workpiece and/or quality of workpieces batches, their manufacturing processes and help identify impairments in the workpieces or process of their production.

According to some embodiments, the width of the aperture/slit of the spectrometry device may range between 1-2000 microns.

According to some embodiments, each the light sources used, may be a single-frequency laser, each outputting a spatially coherent optical beam of a narrow/single wavelength (WL) such as:

a first laser outputting UV light of one of a WL of: 355 nm or 374 nm;

a second laser outputting VIS light of one of a WF of: 405 nm, 457 nm or 452 nm;

a third laser outputting IR light of one of a WL of: 660 nm or 785 nm;

The distance between spots of the multi-spot array 31 is designed in a manner that when imaged onto the spectrometer, forming the spots-image 131, spectrums of different spots will be detected over different sensor pixels-row(s), as shown in FIG. 3B, allowing straightforward separation of their contributions. In practice, it is preferable to make sure the distance between adjacent spectrums of different spots, such as S1 and S1, is of at least two pixel-rows, to avoid 'spillage' of light from spectrum of one spot-image to the other.

It should be noted that such arrangement allows a confocal detection mode: the basic principle behind confocal detection is that contributions coming from parts of the workpiece which are out of focus are rejected, by placing a pinhole at a plane conjugate to the test area of the tested workpiece. The multi-spot method allows for such confocal mode detection when combined with a narrow slit spectrometer-aperture: the slit aperture will obscure defocused contributions on one axis and collecting light from a single sensor line will provide rejection on the other direction. This possibility is not available using the line-spot method described above, as defocused contributions cannot be excluded from the direction parallel to the slit.

Figure 4A:
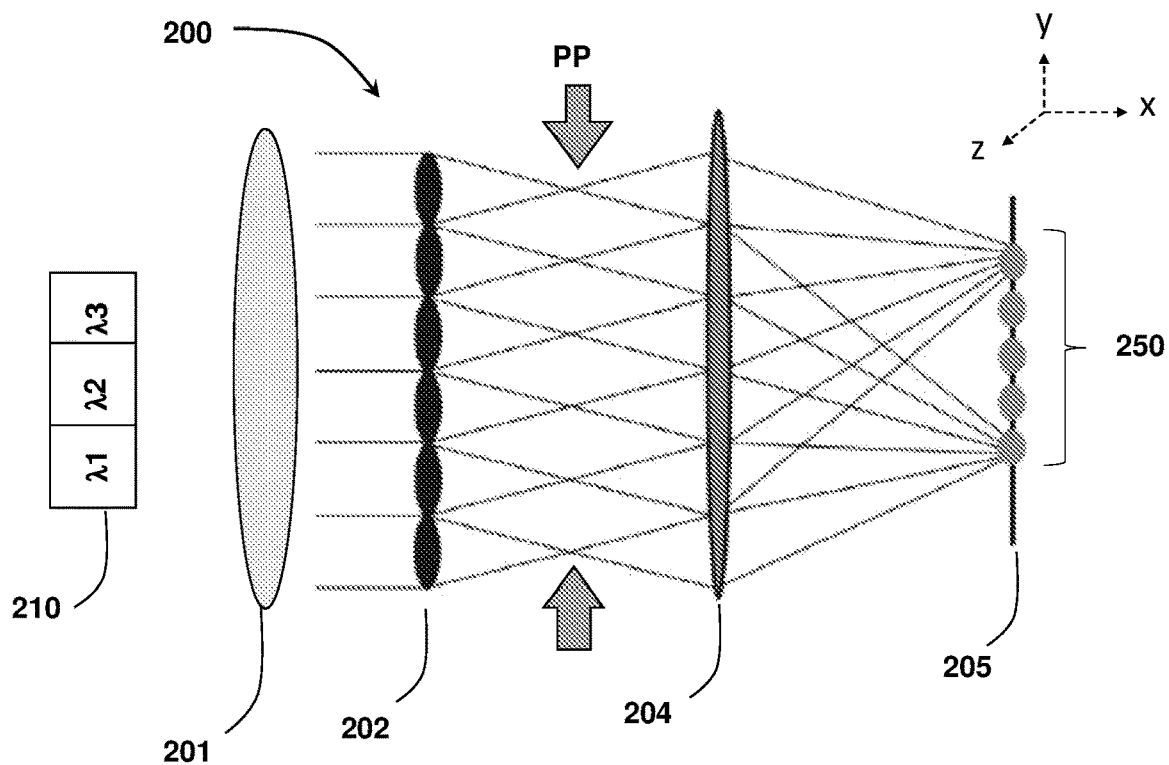
FIGS. 4A and 4B show two designs of a fist optical setup for a spectral detection based metrology system requiring forming a multi-spot-array over a test area of each tested workpiece, for Raman based spectroscopy, using one or more lenslet arrays, according to some embodiments.

To form the multi-spot array over a test area located over a side of the tested workpiece, several optical designs, masks and/or settings may be implemented. For example:

1. Single Micro lens Array (MLA) optical setup 200:

Single MLA optical setup 200 as illustrated in FIG. 4A may include an array of micron-sized lenses (lenslet array 202) arrange in a periodic structure with a given pitch P and focus f followed by a focusing lens 204. The lenslet array 202 is placed over a Fourier plane of the focusing lens 204 with focus F to form a multi-spot-array 250 over the workpiece 205. When illuminating with a coherent and collimated light emanating from an illumination subsystem 210 and collimated by a collimator 201, the lenslet array 202 acts as a diffraction grating mask and generates diffraction orders of a period Δ in the focal plane Δ=FλPP where λ is the WL of the selected laser light source from the illumination subsystem 210 and PP is the location of the pupil plane. The number of the spots N that will be formed over the workpiece's test area can be calculated according to:

$$N = P2\lambda f \qquad \text{Equation 1}$$

This basic setup is very simple to implement at any optical setup. One major advantage is that using only one single optical element such as a single lenslet array 202, we can create a set of spots for multi wavelength illumination, the distance between the spot will change according to the WL of the selected light source. A disadvantage of this method is that the envelope profile of the different spots is strongly dependent on the beam profile (beam wavefront profile) at the entrance to the lenslet array. For generating a flatter "hat-top" envelope profile, a dual MLA optical setup may be required.

Figure 4B:
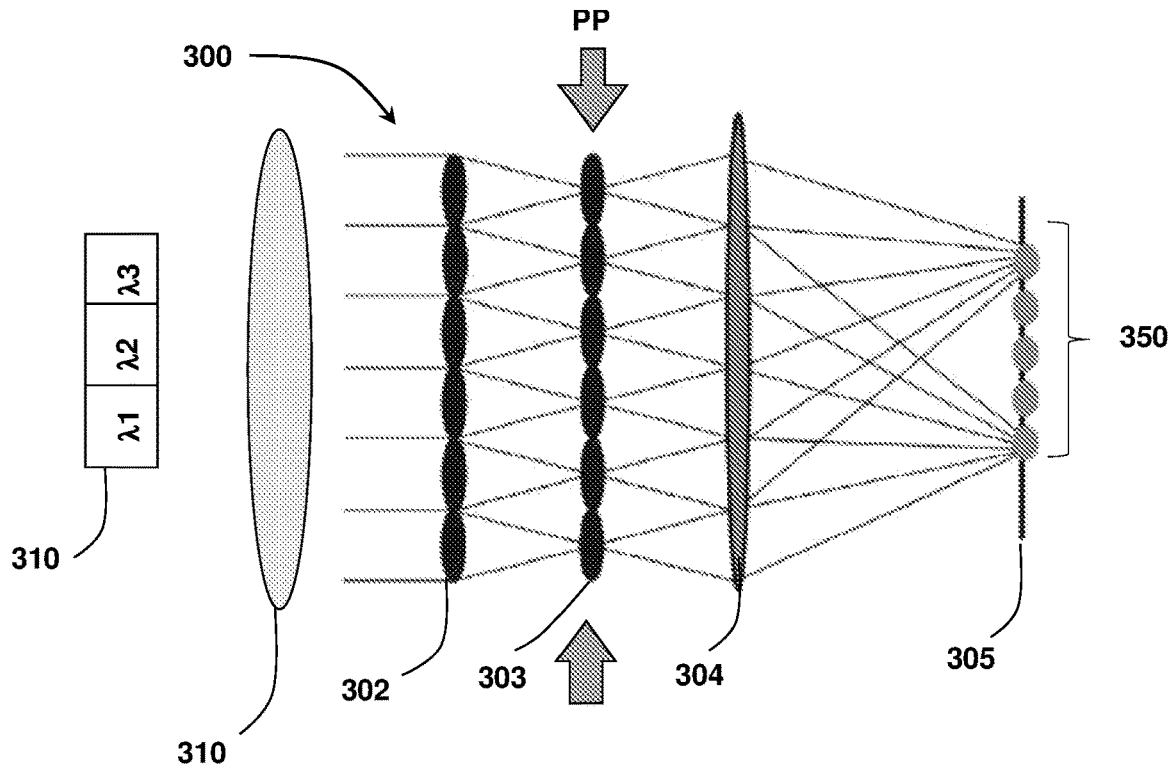

2. Dual MLA optical setup:

The dual MLA optical setup 300 as illustrated in FIG. 4B, consists of an illumination subsystem 310 using several narrow-band light sources, a collimator 310, two lenslet arrays 302 and 303 located parallelly to one another at a distance from the focal length f of the lenslet array 303 and a Fourier lens 304 to form a multi-spot-array 350 over the workpiece 305. The lenslet arrays 302 and 303 may be identical to one another having the same number of micro-lenses and the same micro-lens configuration and size. The first lenslet array 302 splits the incoming collimated light into small beams. The second lenslet array 303 act as field lenses in order to project the entrance pupil of the first arrays 302 to infinity. In the focal point of the Fourier lens 304 all images of the entrance pupils are superimposed. By using an additional lenslet array 303, the light in the focal plane is mixed and flat top envelope is achieved.

Figure 5A:
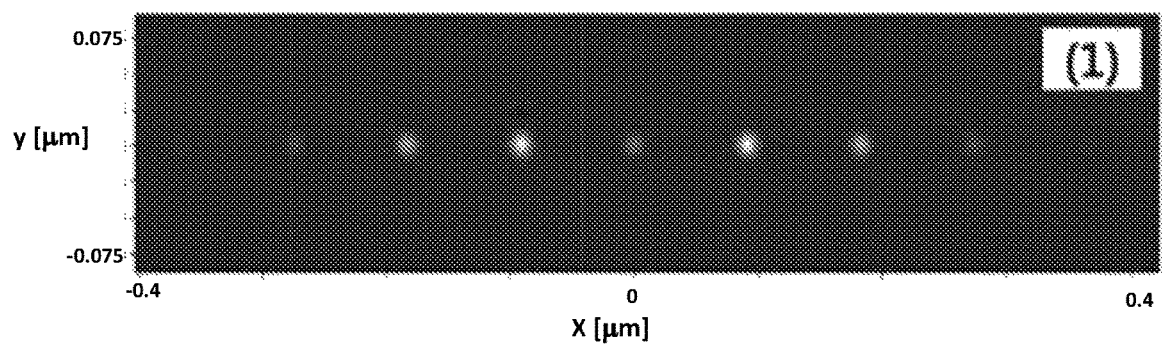
FIGS. 5A, 5B and 5C show a multi-spot-array formed by using one or more lenslet arrays, according to some embodiments.
Figure 5B:
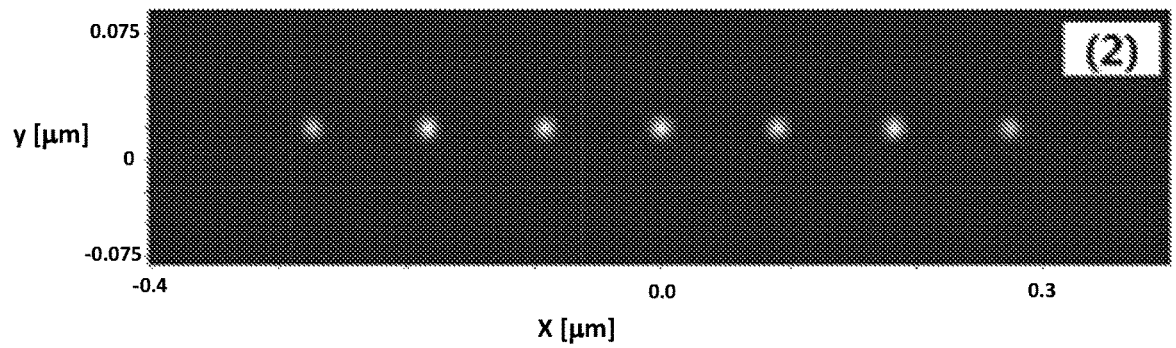
Figure 5C:
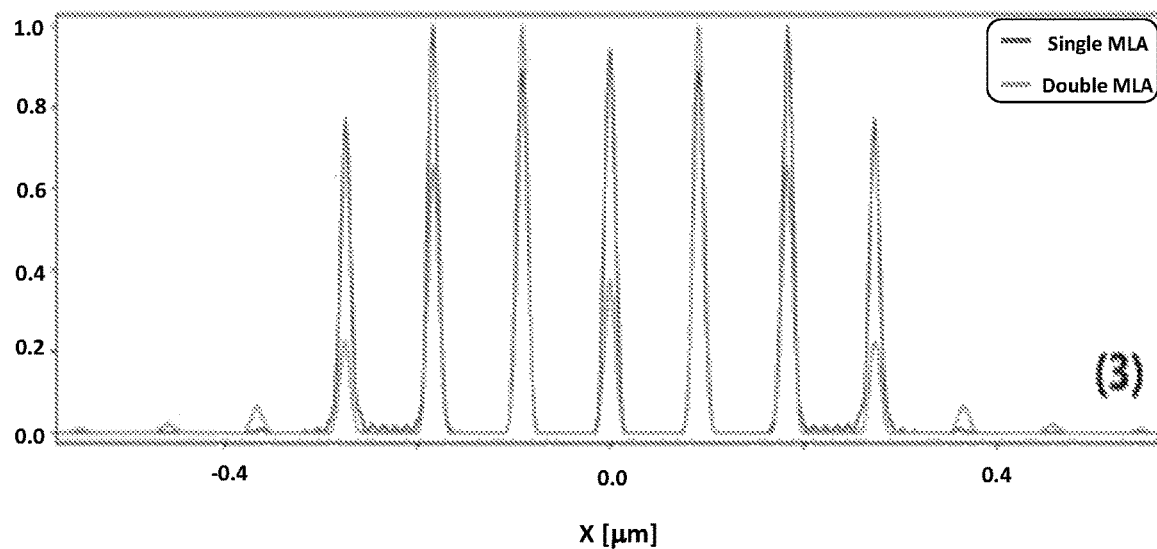

The difference between the two cases of a single MLA optical setup 200 and a dual MLA optical setup 300 is that in the dual MLA setup 300 configuration the second lenslet array 303 added at the pupil plane PP increases/improves intensity uniformity between the different spots of the multi-spot-array formed over the tested workpiece as shown in FIGS. 5A-5C where:

FIG. 5A shows the intensities of the multi-spot-array 250 as formed over the tested workpiece 205 by using the single MLA optical setup 200 showing how the edged/side spots of the array 250 are of a much lower intensity than that of the middle spots.

FIG. 5B shows the intensities of the multi-spot-array 350 as formed over the tested workpiece 305 by using the dual MLA optical setup 300 showing how the edged/side spots of the array 350 are of a slightly lower intensity than that of the middle spots but showing intensity differences between the spots that is significantly smaller than that caused when using a single lenslet array.

FIG. 5C shows the actual intensity differences of the spots of the multi-spot-arrays of the single and the dual MLA optical setups 200 and 300, respectively.

Figure 6:
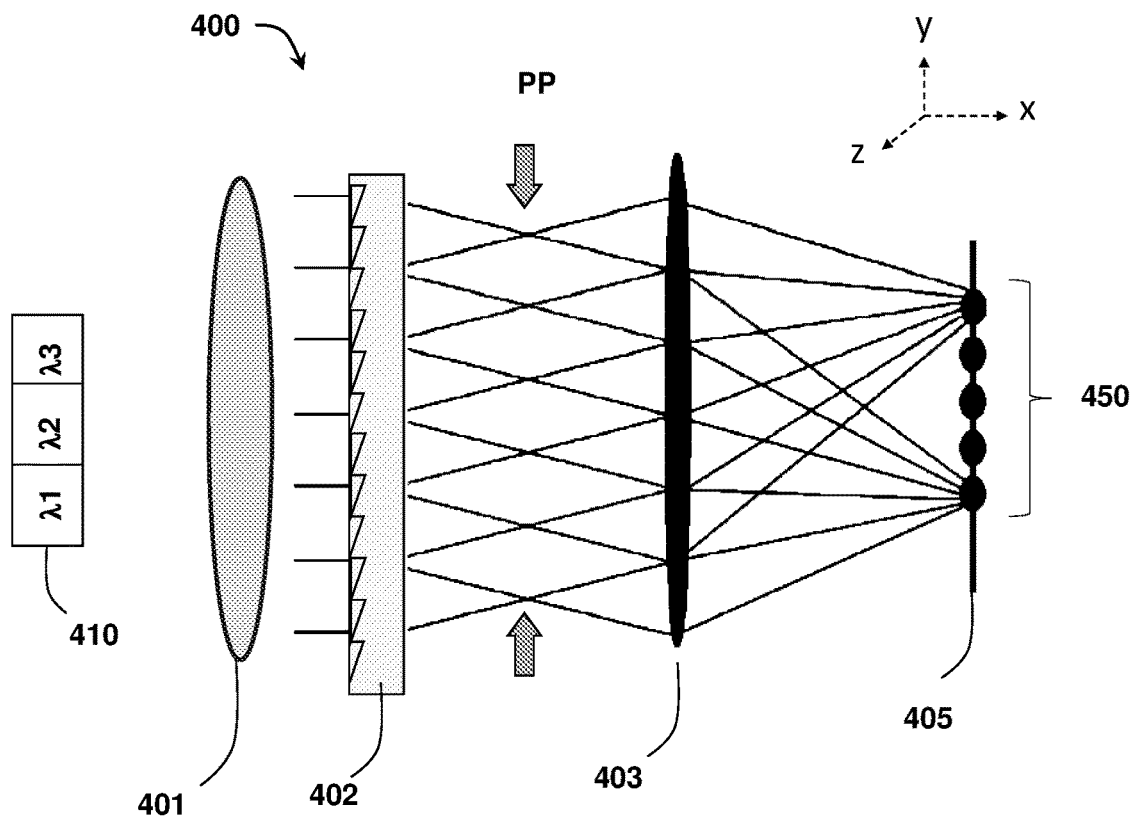
FIG. 6 shows another design of a fist optical setup for a spectral detection based metrology system requiring forming a multi-spot-array over a test area of each tested workpiece, for Raman based spectroscopy, using a diffraction grating element, according to some embodiments.

3. Diffractive element based optical setup 400:

This optical setup 400, as shown in FIG. 6, consists of an illumination subsystem 410, a collimator 401, a diffractive element 402 such as a diffraction grating element positioned over the Fourier plane of a focusing lens 403. The profile topography (e.g., embossment or engraving) of the diffractive element 402 is the inverse Fourier transform of the desired profile in the focal plane to form the desired multi-spot-array 450 over the tested workpiece 405.

The main advantage of using a diffractive element 402, is that any masking profile can be easily generated. However, this method depends strongly on the WL outputted by the light source being used and the illumination beam profile and may not be optimal to any such beam WL and/or profile being used.

Figure 7:
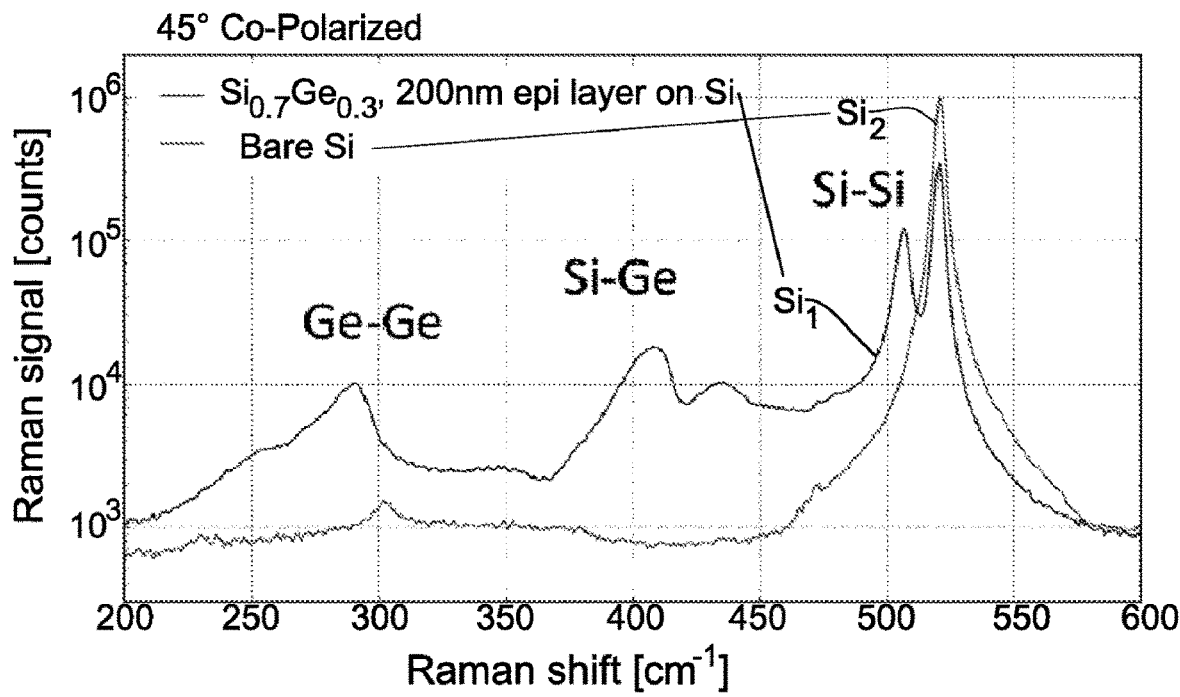
FIG. 7 shows Raman spectrums for two different specimens: a pure bulk Silicon (Si) workpiece and a Si element with a thin coating of a Silicon-Germanium (SiGe)

Each of the optical setups 200/300/400 can be used to form the multi-spot-array over the workpiece to be tested, to detect Raman spectral characteristics thereof. Raman spectroscopy can study, for example, the signal WL or frequency shifts caused due to photon scattering, absorption, photoreflectance and/or photoluminescence that may be typical to specific material, molecular structure, material state etc. FIG. 7 for example show two different Raman scattering distributions for two different materials: (i) for pure Silicon Si workpiece; and (ii) for a Silicon Si workpiece having a Silicon-Germanium (SiGe) coating layer. It is clear that the Raman spectroscopy for each such workpiece has different results and therefore can be used for example to identify coating quality and type for Silicon wafer workpieces.

According to some embodiments, the PCU 150 of the metrology system 100 for example may be configured to compare the resulting Raman spectroscopy resulting spectrums (one spectrum per spot), to known stored spectrum(s) of the tested workpiece material, coating, etc. and/or spectrum of the spots of the same tested workpiece to one another e.g., to identify impairments in the tested workpiece by identifying spots (and their locations) that show different behavior (spectral characteristics) than that of the other spots, although the same material/spectral characteristics should be exhibited if the workpiece was impairments-free. The properties of the differences between the measured spots and the known model or the differences between one spot and the others in the same multi-spot-array may also be identifiable, e.g., for detection of the type, classification and/or severity of the identified impairment.

According to some embodiments, the PCU 150 may also be configured to transmit messages indicative of identified impairment and their detailed properties and/or display information relating to identified impairments to one or more remote devices and/or display devices, e.g., transmitted through on or more communication links/networks.

Figure 8:
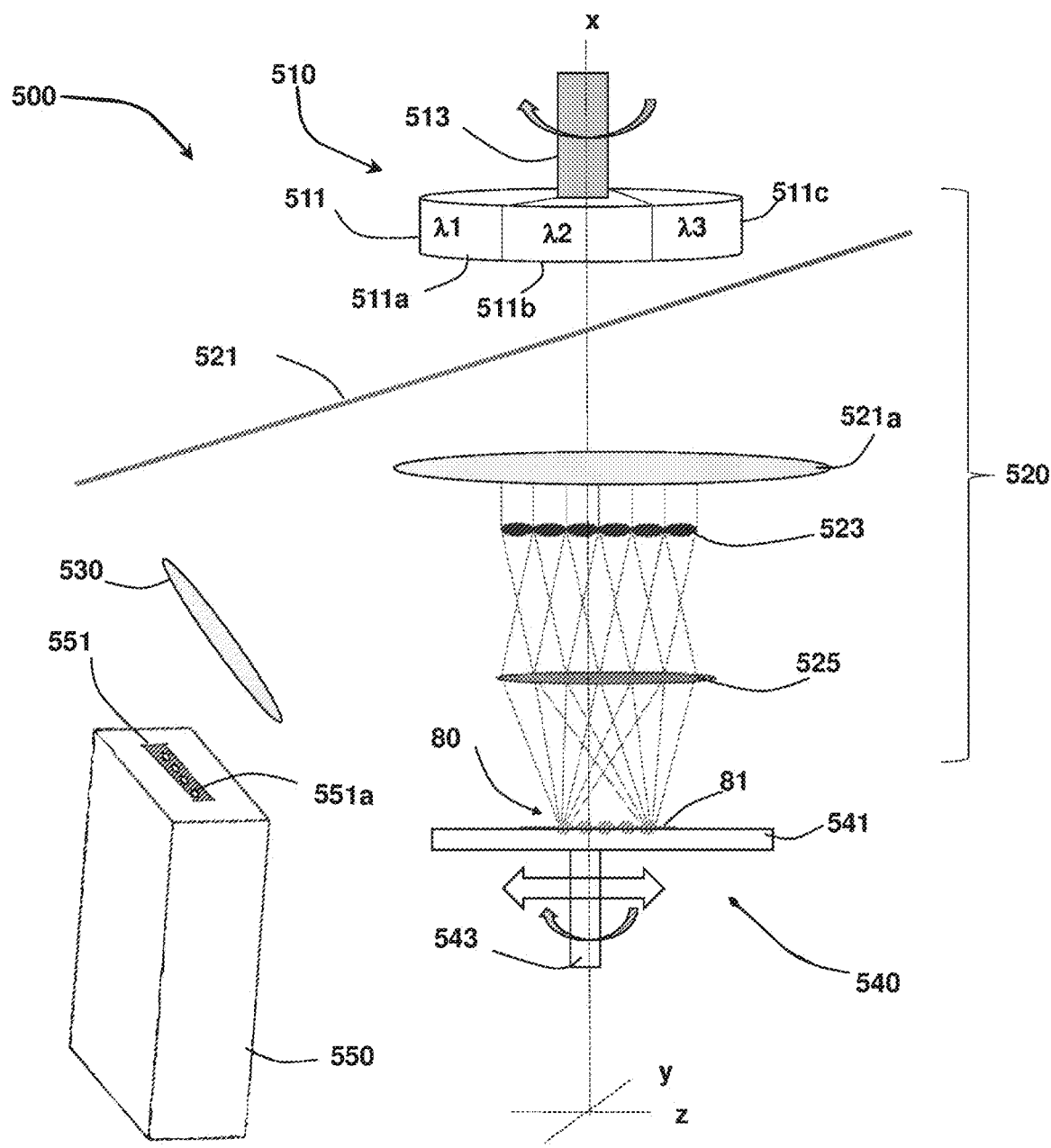
FIG. 8 shows main parts of a metrology system for spectral detection of workpieces, using a single-lenslet array configuration for forming a multi-spot-array over a test area of a tested workpiece for spectral metrology of the workpiece, according to some embodiments.

Reference is now made to FIG. 8, schematically illustrates a spectral metrology system 500, for measuring characteristics of workpieces, according to some embodiments, using Raman spectroscopy based on the single-MLA technique for forming a multi-spot-array.

This metrology system 500 may include for example:
an illumination subsystem 510;
a spectrometer 550 having a narrow elongated (slit) aperture 551;

a first optical setup 520 configured and positioned to direct and divide light emanating from the illumination subsystem 510 such as to form a multi-spot-array(s) 81 over a tested workpiece 80, where the first optical setup 520 includes:
(i) a beam splitter 521 located such as to enable light from the operated light source to pass therethrough along the x axis and light scattered/reflected/deflected from the surface of the tested workpiece 80 to be reflected for directing thereof towards the spectrometer's aperture 551;
(ii) a collimator 521a for collimating light passed the beam splitter 521;
(iii) a lenslet array 523; and
(iv) a Fourier/Focusing/objective lens 525;
a second optical setup including one or more optical elements such as an objective or Fourier lens 530 configured and positioned to form a spots-image 551a over the spectrometer's aperture 551; and
a workpiece handling subsystem 540 configured to adjustably hold each workpiece to be tested and optionally also for readjusting the workpiece's location or optical elements positions for testing various test areas of the workpiece.

According to some embodiments, the illumination subsystem 510 may include at least:
one or more single-frequency light sources 511 such as light sources 511a-511c, each outputting narrow bandwidth and coherent optical signal/beam of a different WL: $\lambda 1$, $\lambda 2$ and $\lambda 3$, respectively;
a selection mechanism (not shown) for selecting a required light source for the acquisition and operating the selected light source (e.g., using a switching mechanism for operating and deactivating light sources based on operation selections); and
a positioning mechanism for positioning the selected light source in a desired positioning for optical alignment thereof with other optical elements of the system 500, e.g., using a rotatable shaft 513 connected to a rotatable installation holding the light sources 511a-511c, rotatable about an axis x by one or more motors (not shown) connected thereto.

According to some embodiments, the workpiece handling subsystem 540 may include at least:
a movable support e.g. including a stage platform 541 connected to a rotatable shaft-support 543 connected to a lower side of the stage support 541, for rotating thereof (the shaft 543 may be rotated by a motor (not shown)), where the movable support if configured for holding the tested workpiece 80 and for adjustably moving for adjusting the position of the test area of the tested workpiece 80 in respect to other components of the system 500 for optical alignment thereof in an optimal manner e.g., in respect to the position of the light source beam direction (e.g. along the x axis) and in respect to the positioning of optical elements of the optical setups 520 and 530

In some cases, the workpiece handling subsystem 540 may also include a sampling controller, configured for at least one of: automatic placing of each workpiece to be tested over the movable support, selecting test area, selecting positioning of the tested workpiece over the movable support and for controlling the movable support for adjusting measuring-position of each tested workpiece.

In some cases, the workpiece handling subsystem 540 may also include one or more sensors such as optical sensors, for sensing position of the workpiece placed thereover.

Figure 9:
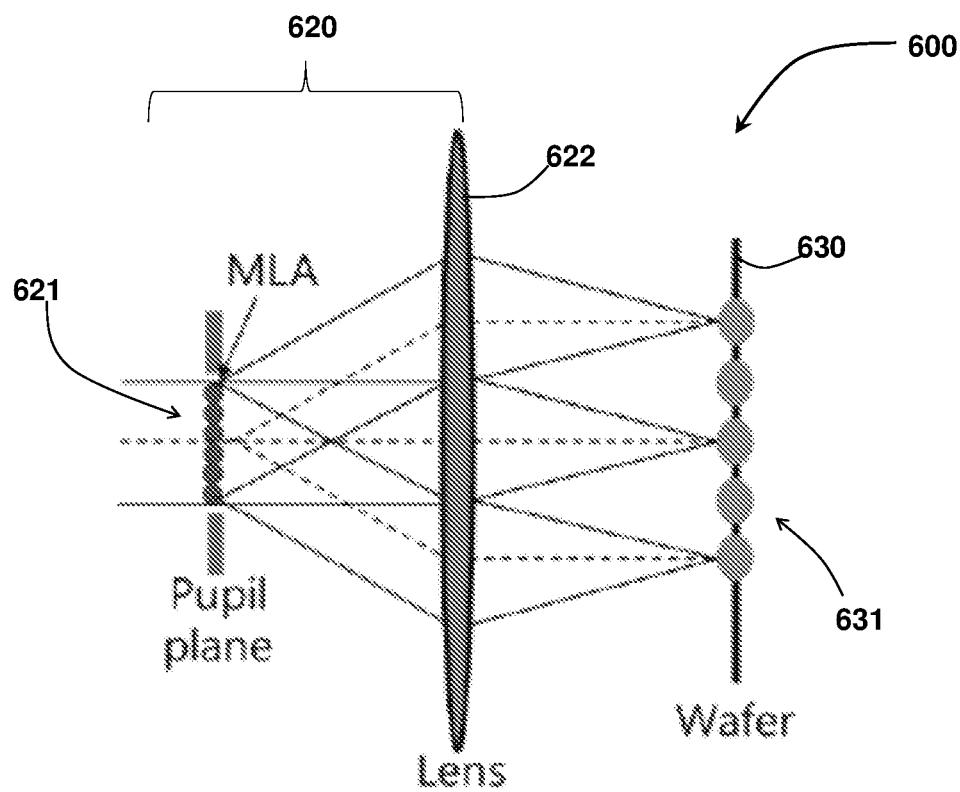
FIG. 9 shows a first optical setup used for forming a multi-spot-array by using a single lenslet array, according to other embodiments.

Reference is now made to FIGS. 9-12 showing other designs for single-MLA based optical subsystem for forming a multi-spots-array:

FIG. 9 shows a first optical setup 620 of a metrology system 600 used for forming a multi-spot-array 631 over e tested workpiece 630, by using a single lenslet array 621 (single MLA), according to embodiments, in which the lenslet array 621 is placed at the pupil plane, also using a Fourier lens 622, creating a set of identical spots of the multi-spot-array 631 at the focal plane FP, with an identical numerical aperture (NA) forming a telecentric illumination at the test area of the tested workpiece 630.

Figure 10:
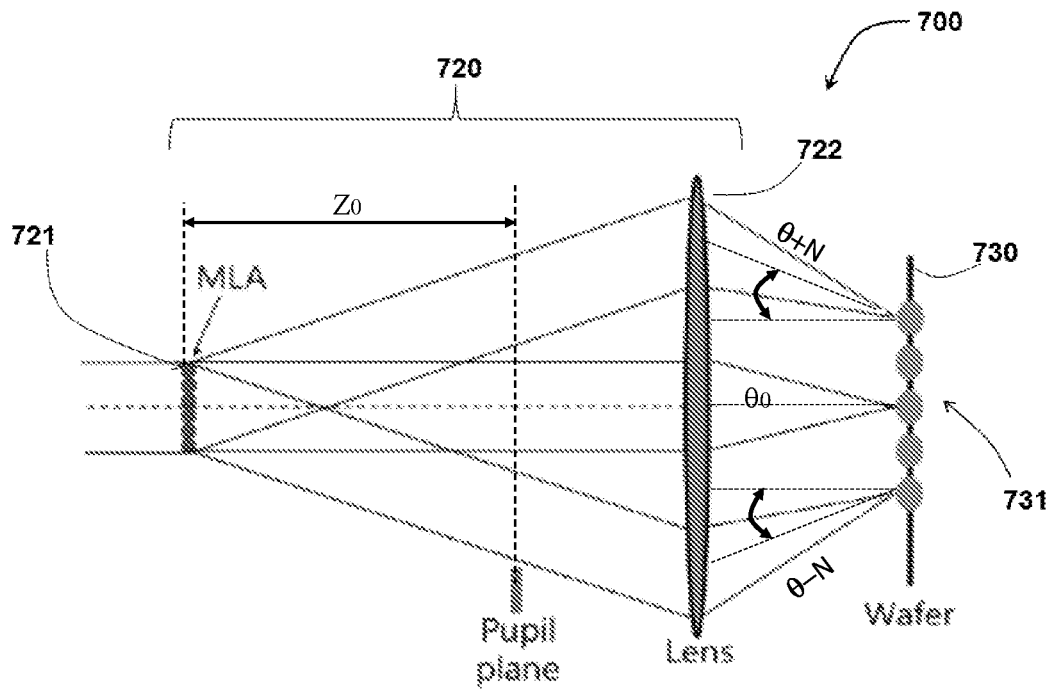
FIG. 10 shows a first optical setup used for forming a multi-spot-array by using a single lenslet array, according to other embodiments.

FIG. 10 shows a first optical setup 720 of a metrology system 700, used for forming a multi-spot-array 731 over a tested workpiece 730, where the first optical setup 720 includes a single lenslet array 721 and a Fourier lens 722, where the lenslet array 720 is located at a distance $Z_0$ from the pupil plane creating a non-telecentric imaging and thus different angle of incidence (AOI) for each spot of the multi-spot-array 731.

In the above exemplary embodiments, shown in FIGS. 9 and 10, the spots of each of the multi-spot-arrays 620 and 720 are all of the same size, shape and dimensions.

Figure 11:
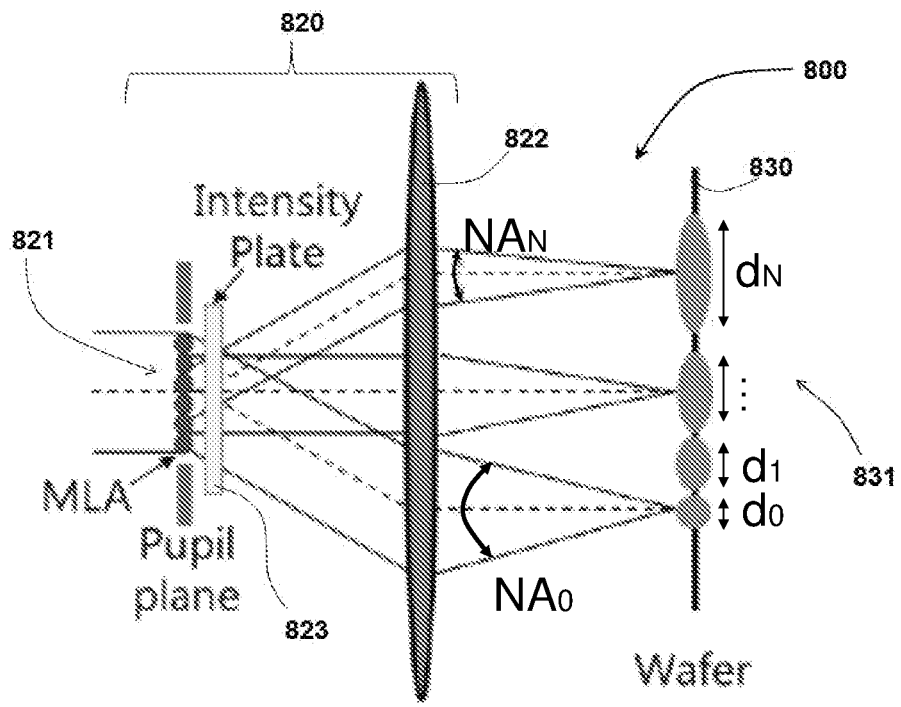
FIG. 11 shows a first optical setup used for forming a multi-spot-array by using a single lenslet array and an intensity plate, according to other embodiments.

FIG. 11 shows a first optical setup 820 of a metrology system 800, used for forming a multi-spot-array 831 over a tested workpiece 830, including a lenslet array 820, a Fourier lens 822, and an intensity varying plate 823, according to other embodiments. The intensity varying plate 823 (such as a zone plate e.g., using a diffractive element such as a diffraction grating element) may be placed adjacent to the lenslet array 821 between the lenslet array 821 and the lens 822 to form a multi-spot-array 831 over the test area of the tested workpiece 830 that has spots of different sizes and optionally also of different shapes.

Figure 12:
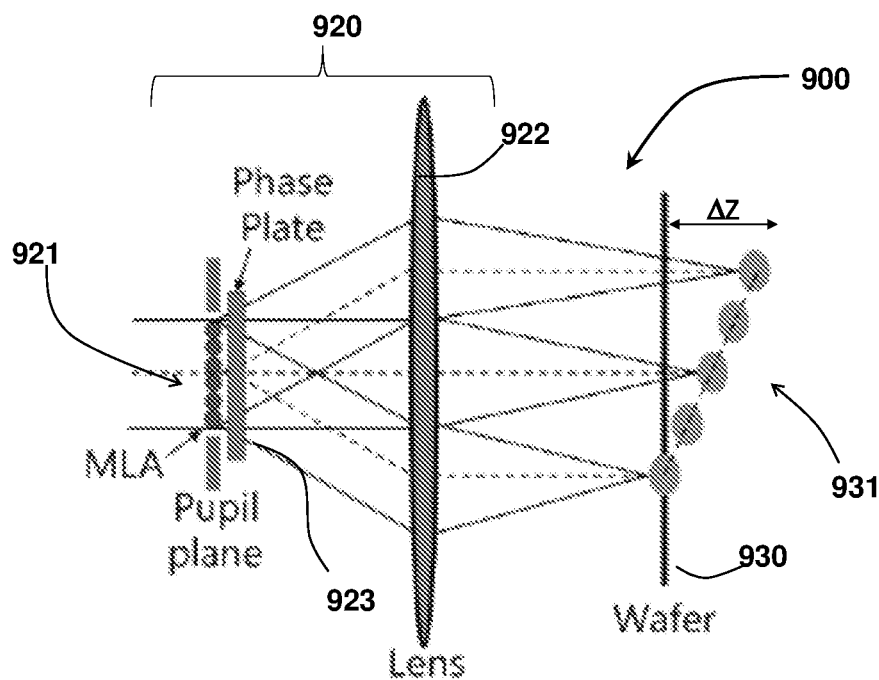
FIG. 12 shows a first optical setup used for forming a multi-spot-array by using a single lenslet array and a phase plate, according to other embodiments.

FIG. 12 shows a first optical setup 920 of a metrology system 900, used for forming a multi-spot-array 931 over a tested workpiece 930, including a lenslet array 920, a Fourier lens 922, and phase plate 923, according to other embodiments. The phase plate 923 (such as a waveplate) may be placed adjacent to the lenslet array 921 between the lenslet array 921 and the lens 922 to form a multi-spot-array 931 over the test area of the tested workpiece 930 that has spots of different sizes and optionally also of different shapes, by shifting phase of the optical signal per each micro-lens of the lenslet array 921 thereby shifting focal plane of each spot.

In the above exemplary embodiments, shown in FIGS. 11 and 12 the spots of each of the multi-spot-arrays 820 and 920 are of increasing sizes such that the spots are enlarged in a specific direction over the test area having increased diameters for example (as shown in FIG. 11).

Figure 13:
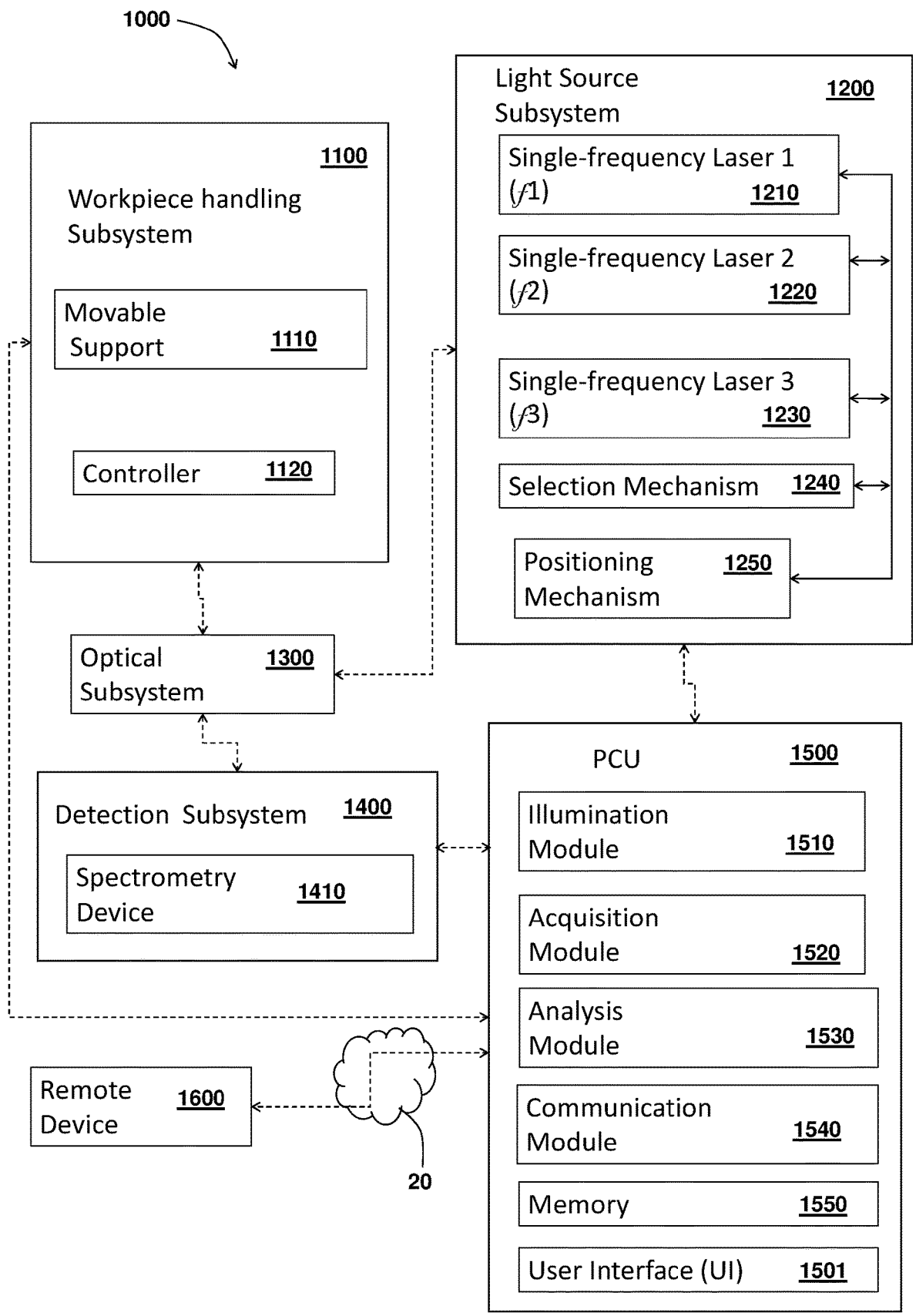
FIG. 13 shows a block diagram illustrating a metrology system for spectral metrology of workpieces, according to some embodiments.

FIG. 13 shows a block diagram illustrating a metrology system 1000 for spectral metrology of workpieces, according to some embodiments. The metrology system 1000 may include at least: a workpiece handling subsystem 1100; an illumination subsystem 1200; an optical subsystem 1300, a detection subsystem 1400 and a processing and control unit PCU) 1500.

According to s some embodiments:
(i) the workpiece handling subsystem 1100 may include a
  movable support 1110 configured for adjustable positioning of each workpiece to be tested e.g., based on required test area location, light source position, scanning mode etc.; and a sampling controller 1120 which may be configured to control placement of workpieces to be tested over a stage/conveyor belt of the movable supports for fast scanning (by spectral metrology) of multiple workpieces one after the other and the like;
(ii) the illumination subsystem may include:
one or more single-frequency light sources such as single-frequency lasers 1210-1230 each output coherent beam/light of a different EL;
a selection mechanism 1240 including hardware, mechanical and/or electronic means for enabling selection of a light source for operation and operating the selected source (e.g., by on/off switching control)—where for each workpiece been tested (depending on workpiece type) the metrology scanning can be done for several WLs for improving characteristics measuring accuracy; and
a positioning mechanism 1250 for positioning the selected light source in a predefined single illumination position;
(iii) the optical subsystem 1300 may include single/double MLA optical elements configurations as described above for forming a single-row multi-spot-array over the test area of each tested workpieces or any other optical setups arrangements depending on required multi-spot-array(s) configuration;
(iv) the detection subsystem 1400 may include a spectrometry device 1410 configured for performing pixelated Raman spectroscopy detection; and
(v) the PCU 1500 may include software and/or hardware based modules such as:
  an illumination module 1510 configured to control illumination, such as for example to control selection of light sources, setting illumination properties such as intensity/amplitude/power adjustment of selected light sources, light source positioning etc.;
  an acquisition module 1520 configured to control acquisition (e.g. via scanning or non-scanning mode) of spectral related data e.g., by controlling the optical and/or the acquisition subsystems 1300/1400 and optionally also by controlling the workpiece handling subsystem 1100 e.g., for controlling workpieces' type selection, workpieces' positioning, test area positioning adjustments and selection etc.;
an analysis module 1530 configured to analyze (e.g. in real time or near real time) the acquired spectral data for determining workpieces' physical characteristics (using Raman spectroscopy based analysis algorithms/programs etc.) for example for quality control of tested workpieces;
a communication module 1540 configured to communicate with all the subsystems 1100-1400 as well as with one or more other remote devices such as remote device 1600 and/or one or more output devices such as visual output devices (screens, computers, audio-video devices etc.) for displaying information indicative of and/or associated with determined workpieces' characteristics, via one or more communication networks such as network 20; and
memory 1550 for storing data associated with: accumulated acquired information, databases for different workpiece types and their associated metrology programs (e.g., including all operational commands, thresholds, ranges for calculations, calculation algorithms and the like for conducting metrology of workpieces of the specific types, databased for models of known spectrums of various workpiece types and the like.

According to some embodiments, the analysis module 1530 may use one or more machine-learning analysis programs/algorithms using accumulated workpieces' measured spectrums to calibrate analysis thresholds and/or ranges values, create and update models for defining flawless workpiece spectral behavior and impairment types and their associated spectral behavior for easy and quick impairments identification (and their severity) by models based comparison.

According to some embodiments, the remote device(s) may be any one or more of: a mobile device such as a mobile phone and/or a tablet, a personal computer (PC), a laptop device etc. enabling data input, processing, display, output, communication and storage. In some embodiments a designated mobile application may be used operable via the users' mobile devices for receiving and displaying of information relating to metrology results, alerts for impairments in one or more workpieces of one or more manufactured batches etc.

According to some embodiments, the PCU 1500 may further include or operate a user interface (UI) such as UI 1501, for enabling users to input selections information and/or control input data therethrough such as: select workpieces' type to be measured, input known material compound/composition of the selected workpiece, input workpiece coating information etc. for enabling automatic metrology and analysis by automatic selection of a specific acquisition program (from stored programs) associated with the specific inputted information.

The PCU 1500 may be operated by and/or embedded in at least one computer device (stationary or mobile) via one or more specially designed and installable programs for supporting all UI, analysis, control, storage, communication and machine-learning operations especially designed for the metrology system 1000.

Reference is now made to FIG. 14 showing a flowchart for illustrating some of the steps of a process (method) for spectral metrology of workpieces, according to some embodiments, the metrology process may include one or more of the steps of:
holding each element to be tested at a specific required measuring-position 61;
forming at least one multi-spot-array over a test area of the tested element, using light emanating from at least one light source, manipulated by least one optical element, wherein the at least one multi-spot-array has multiple light spots 62;
detecting spectral characteristics of one or more spots of the multi-spot-array 63;
determining one or more properties of the test area of the tested workpiece, based on determined spectral characteristics of the one or more spots of the multi-spot-array 64.

Figure 15:
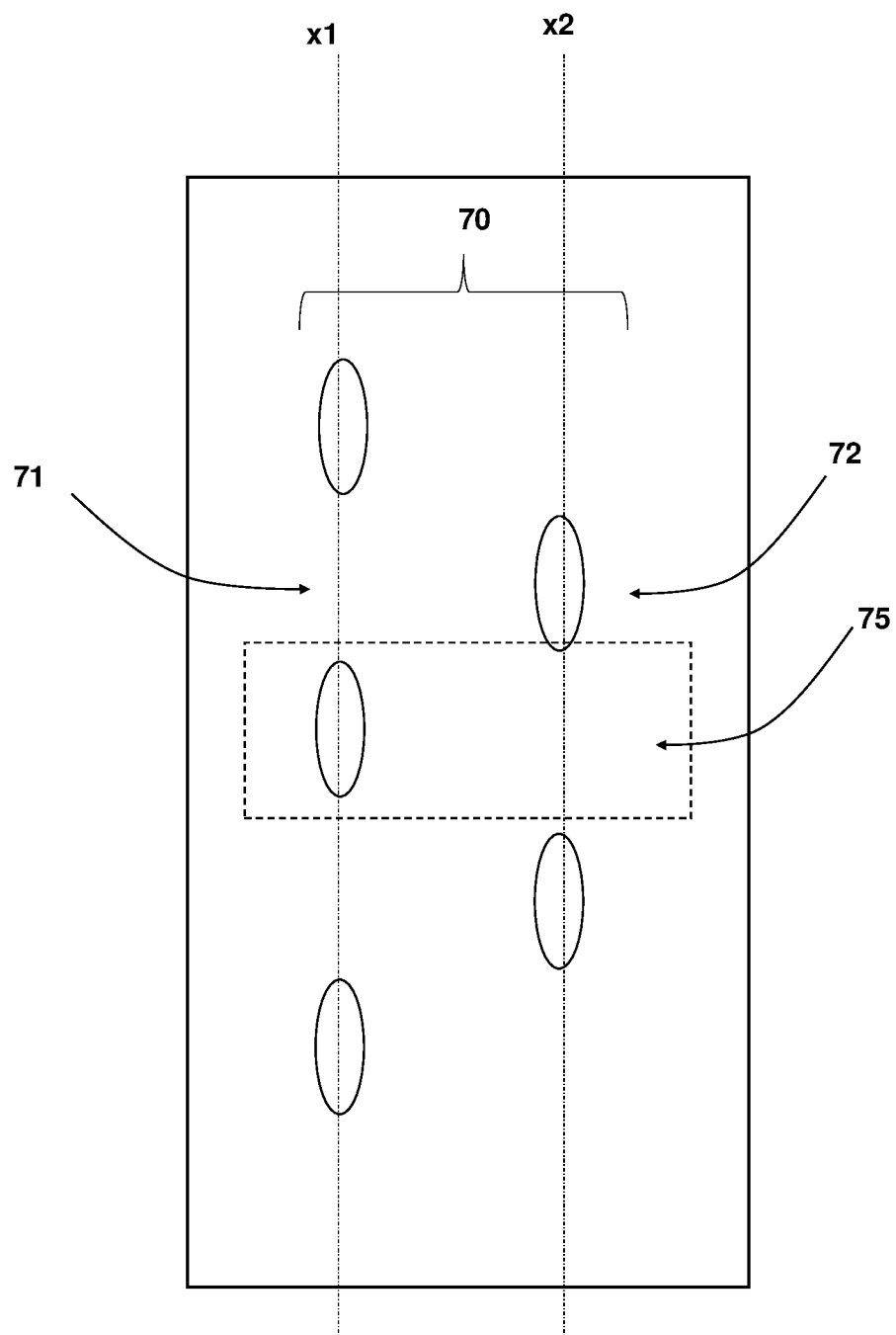
FIG. 15 shows a spots arrangement that includes a double rowed multi-spot-array including two multi-spot-arrays arranged as a two spots rows with alternating locations, according to some embodiments.

FIG. 15 shows a spots arrangement that includes a double rowed multi-spot-array including two multi-spot-arrays arranged as two spots rows with alternating locations, according to some embodiments.

Other embodiments of the metrology system may be designed for forming other spots configurations, in which the spots are not necessarily arranged in a single row/line, e.g., for improving heat dissipation and increasing the number of spots for a very limited test area space. Specifically, heat dissipation from the illuminated spots can be improved by increasing the spots' spatial separation. However, as discussed above, it is commonly required that the measured region is confined to fit the spectrometer aperture dimensions.

The sub-spot approach allows another flexibility, in that spots can be arranged in a meandering (alternating-locations) pattern 70 of two parallel rows of spots 71 and 72 with an optimal (maximal) distance between each two or more adjacent spots (See FIG. 15) for optimal heat dissipation: e.g., by arranging the rows 71 and 72 in an off-set manner such that each strap of space 75 only includes a single spot from one of the two adjacent rows 71 and 72.

When using such design, the spots still have to be separated in the direction parallel to the slit aperture of the spectrometry device, as discussed above. However, in the direction perpendicular to the slit, they can be arranged more sparsely from on another. Importantly, the measured spectrum has to be calibrated separately for each spot, as this approach would inherently introduce spectral offsets at the spectrometer. This can be done in a straightforward manner, by measuring a flawless known workpiece with well-known Raman spectrum (e.g. pure Si) and allocating a separate calibration for each spot spectrum based on known (pre-measured) modeled Raman spectrums of each spot.

Such approach can still be used for confocal metrology, although here the spectrometer aperture would have to be adapted (e.g. in shape and/or dimensions) according to the spots' locations and spatial arrangement or vice versa.

According to some embodiments, optical signals from the different spots can be averaged to obtain a mean Raman spectral readout from the test area of the tested workpiece. However, it is also possible to treat each spot separately and obtain a set of multiple Raman spectra from the different corresponding locations. Such parallel acquisition can significantly speed up Raman mapping, i.e. a characterization of the position-dependent Raman signal.

an important flexibility allowed by the above proposed embodiments, is to have different spots provide different measurement conditions, for example:

The system can be configured such that different spots arrive from different angles-of-incidence (AOIs). As in the proposed scheme data from different spots is obtained separately, this approach can provide information on the AOI-dependence of the signal in single acquisition.

Another possibility is to assign each spot with a different angular span, meaning—effectively having a different numerical aperture (NA) for each spot and therefore enabling using spots of different sizes, as the maximal size of each spot is limited to its diffraction-limit, which depends on the NA (roughly given by $\lambda$/NA wherein $\lambda$ is the laser light source's output wavelength), in this case we can also obtain the signal dependence on the measured spot size (see for example patent application publication no.: PCT/IL2019/050847, which is incorporated herein by reference in its entirety).

Embodiments of the present invention can provide at least the following advantages:

1. Throughput enhancement: as discussed above, the reduced power density per spot and improved heat dissipation provided by this idea can allow significantly higher power to be used without increasing damage to the tested workpiece. Measured signal would be correspondingly stronger, reducing the amount of acquisition time required for optimal SNR. This advantage may be of special importance for large-scale industrial use.

2. Spatial mapping, scanning and/or imaging mode: when the tested workpiece surface is inhomogeneous, and information is required concerning the spatial variations of the measured properties, the proposed approaches offer two advantages compared to other alternatives: the obtained spatial resolution is superior to what is typically obtained using a line-focus approach, as each spot is in fact diffraction-limited; moreover, data can be obtained in parallel (simultaneously) for all of the formed spots. For example, if a ten-spots multi-spot-array is implemented, a single acquisition allows acquiring information for ten different locations of the tested workpiece—significantly reducing measurement time and increasing test area size.

3. Acquiring dependency on measurement conditions: as discussed above, in some proposed implementations of the system and method, inherent differences are introduced between the spots. These can be different angles of incidence, angular span and defocus. When measuring a homogeneous sample—in which all spots are of different structures, size, shape, distance from adjacent spots, etc., can provide details on the measurement dependency on these parameters at a single acquisition. For example, a through-focus measurement can be obtained by a single acquisition—when information from all (non-uniform) spots is combined together.

According to some embodiments, one or more of the method or system designed described above may be also embedded in a hybrid metrology system using additional measuring techniques and devices to combine detected information from several devices to optimize workpieces characteristics detection and analysis. For example, the above technique(s) may be embedded in a hybrid metrology system such as described in International Patent Application No. WO2017/103935A1, which is incorporated herein by reference in its entirety.

According to some embodiments, the optical subsystem of any one or more of the metrology systems described above may also include one or more polarization controlling optical elements for polarized Raman spectroscopy, using some of the means and techniques as taught, for example, in International Patent Application No: WO2020/021554A1, which is incorporated herein by reference in its entirety.

EXAMPLES

Example 1 is a metrology system for measuring characteristics of workpieces, the metrology system comprising at least:
- an illumination subsystem comprising at least one light source;
- a workpiece handling subsystem configured at least for holding each tested workpiece to be measured at a specific required measuring-position;
- an optical subsystem configured and arranged to form at least one multi-spot-array, from light emanating from the at least one light source, over a test area of the tested workpiece;
- at least one spectrometry device having at least one aperture, positioned at a specific relative-position in respect to the test area of the tested workpiece, wherein the optical subsystem is further arranged and configured to direct light emanating from the multi-spot-array, onto the at least one aperture of the spectrometry device, for detecting spectral characteristics of one or more spots of the multi-spot-array;
- at least one processing and control unit (PCU), configured to receive spectral output data from the at least one spectrometry device to determine spectral characteristics of the one or more spots of the multi-spot-array, and determine one or more properties of the tested area of the tested workpiece, based on determined spectral characteristics of the one or more spots,
wherein the distribution of energy density or flux of the at least one multi-spot-array over the test area of the tested workpiece is such that prevents affecting the workpiece during its testing.

In example 2, the subject matter of example 1 may include, wherein the at least one spectrometry device is configured for using: Raman spectroscopy, photoluminescence and/or photoreflectance spectroscopy of the spots-image.

In example 3, the subject matter of any one or more of examples 1 to 2 may include, 1 to 2, wherein the optical subsystem is further arranged and configured to form a spots-image of the multi-spot-array, over the at least one aperture of the spectrometry device, for detecting spectral characteristics of each spot of the spots-image corresponding to the spots of the multi-spot-array, for determining characteristics of the workpiece.

In example 4, the subject matter of any one or more of examples 1 to 3 may include, wherein the spectrometry device comprises: a diffractive optical element (DOE); and a pixelated optical detector, located such that each spots-image projected onto the at least one aperture is diffracted, reflected and/or scattered by the DOE and wherein light the DOE, is directed such as to be detected by the pixelated optical detector to form a pixelated spectral data of each spot of the multi-spot-array.

In example 5, the subject matter of example 4 may include, wherein the DOE comprises a diffraction grating element.

In example 6, the subject matter of any one or more of examples 4 to 5 may include, wherein the DOE is located such that an input surface of the DOE faces the at least one aperture of the spectrometry device.

In example 7, the subject matter of any one or more of examples 4 to 6 may include, wherein the pixelated optical detector comprises any one of: charged coupled device (CCD), active pixel sensor (APS), pixelated RGB or RGBY camera.

In example 8, the subject matter of any one or more of examples 1 to 7 may include, wherein the optical subsystem comprises:
- a first optical setup comprising one or more optical elements, configured and positioned to divide, direct and/or manipulate the light emanating from each light source of the illumination subsystem into several spots to form the at least one multi-spot-array over the test area; and
- a second optical setup comprising one or more optical elements, configured and positioned to form a spots-image over the at least one aperture of the at least one spectrometry device.

In example 9, the subject matter of example 8 may include, wherein each of the at least one light source is a single-frequency light source outputting ultraviolet (UV), near UV, visible (VIS), infrared (IR), or near IR (NIR) light of a narrow wavelength or frequency bandwidth.

In example 10, the subject matter of example 9 may include, wherein the wavelength bandwidth of light outputted by each single-frequency light source is smaller than a bandwidth threshold ranging between 0-2 picometer (pm).

In example 11, the subject matter of any one or more of examples 8 to 10 may include, wherein the illumination subsystem comprises:
- several light sources each outputting light in a different wavelength; and a selection mechanism for selecting one light source and operating the selected light source.

In example 12, the subject matter of example 11 may include, wherein the illumination subsystem further comprises a positioning mechanism for controlling and adjusting position of the selected light source, in respect to other optical elements of the metrology system.

In example 13, the subject matter of any one or more of examples 1 to 12 may include, wherein the workpiece handling subsystem, holding the tested workpiece comprises:
- a movable support configured for holding the tested workpiece and for adjustably moving; and
- a sampling controller, configured for at least one of: automatic placing of each workpiece to be tested over the movable support, selecting test area, selecting positioning of the tested workpiece over the movable support and for controlling the movable support for adjusting measuring-position of each tested workpiece.

In example 14, the subject matter of any one or more of examples 1 to 13 may include, wherein each multi-spot-array is arranged such that the light sports thereof are aligned in a row.

In example 15, the subject matter of any one or more of examples 1 to 14 may include, wherein each light spot of each multi-spot-array is of the same size and dimensions.

In example 16, the subject matter of any one or more of examples 1 to 14 may include, wherein each light spot of each multi-spot-array is of a different size, shape and/or dimensions.

In example 17, the subject matter of any one or more of examples 1 to 16 may include, wherein the at least one aperture of the at least one spectrometry device has an elongated shape to receive therein or thereover, a spots-image aligned as at least one row emanating from the multi-spot-array.

In example 18, the subject matter of any one or more of examples 1 to 17 may include, wherein the optical subsystem comprises:
- at least one beam splitter for dividing light emanating from the at least one light source and reflecting light arriving from the tested workpiece;
- a collimator configured to collimate light beam emanating from the at least one light source;
- at least one lenslet array comprising an array of focusing micro-lenses located between the collimator and the tested workpiece, wherein the at least one lenslet array is positioned and configured to have collimated light manipulated to form the at least one multi-spot-array over the tested workpiece test area; and
- a focusing lens located between the at least one lenslet array and the tested workpiece.

In example 19, the subject matter of example 18 may include, wherein the at least one lenslet array comprises two lenslet arrays located parallelly to one another, wherein one of the two lenslet arrays is located at a pupil plane of the micro-lenses of the other lenslet array.

In example 20, the subject matter of example 18 may include, wherein the at least one lenslet array comprises a single lenslet array positioned at a non-zero distance from a pupil plane of the focusing lens creating different angles of incidence for each spot of the multi-spot-array formed over the tested workpiece, or over the pupil plan of the focusing lens creating the same angle of incidence (AOI) for each spot of the multi-spot-array formed over the tested workpiece.

In example 21, the subject matter of example 20 may include, wherein the lenslet array is located at a non-zero distance from the pupil plane and wherein the optical subsystem further comprises an intensity-varying plate or a phase plate, positioned between the lenslet array and the focusing lens, wherein the intensity varying plate or the phase plate is configured and located to form a multi-spot-array over the tested workpiece having spots of different sizes.

In example 22, the subject matter of any one or more of examples 1 to 21 may include, wherein the maximum radius or length of each spot of the multi-spot-array is equal to or higher than a diffraction limit, which depends on the wavelength and bandwidth of the light source and optical elements being used and their relative positioning.

In example 23, the subject matter of example 22 may include, wherein the maximum size of the multi-spot-array is equal or lower than the test area size to fit entirely within the test area of the tested workpiece.

In example 24, the subject matter of any one or more of examples 1 to 23 may include, wherein the PCU comprises at least:
- an illumination controller configured to control the illumination subsystem;
- a metrology controller, configured to control measurements of workpieces properties by selection or allocation and operation of specific one or more executable acquisition programs for each workpiece type and required workpiece properties measurements being selected or determined;
- an analysis module, configured to receive spectral output data from the spectrometry device and analyze the received spectral output data for each tested workpiece and each test area and determine tested workpiece's test area properties, using one or more adjustable analysis programs;
- a display controller for controlling display of information associated at least with analysis results, wherein the display is done via one or more local and/or remote output devices; and
- a memory unit for storing at least the one or more adjustable analysis programs, accumulating received spectral output data for different workpieces, and/or control commands, protocols and/or programs.

In example 25, the subject matter of example 24 may include, wherein the metrology system further comprises a user interface (UI) operable via a local or a remote device, the UI being configured to allow users to input acquisition related information for defining various workpieces' acquisition parameter, wherein the metrology controller may be further configured to receive input information from the UI and control metrology of workpieces, based on the input information.

In 26, the subject matter of example 25 may include, wherein the input information comprises one or more of the following selectable input parameters: workpiece type, number of workpieces in each workpieces batch to be tested, one or more test areas to be tested in each workpiece, selected one or more operation wavelength/frequency, acquisition duration per test area, wherein each different input parameters combination, selected by the user through the UI, is associated with a different executable acquisition program enabling automatic control of the testing of the entire selected batch of the same workpiece type to be tested.

In example 27, the subject matter of any one or more of examples 1 to 26 may include, being configured to form a plurality of multi-spot arrays over the test area of the tested workpiece, wherein the spectrometry device comprises a wide aperture or a plurality of elongated apertures.

Example 28 is a method for measuring characteristics of workpieces, using an optical metrology system, the method comprising at least:
holding each workpiece to be tested at a specific required measuring-position;
forming at least one multi-spot-array over a test area of the tested workpiece, using light emanating from an illumination subsystem comprising at least one light source;
detecting spectral characteristics of one or more light spots of the at least one multi-spot-array;
determining one or more properties of the test area of the tested workpiece, based on determined spectral characteristics of the one or more light spots of the multi-spot-array, wherein the distribution of energy density or flux of the at least one multi-spot-array over the test area of the tested workpiece is such that prevents affecting the workpiece during its measuring.

In example 29, the subject matter of example 28 may include, wherein the spectral characteristics of spot of the spots-image is done using one or more of the following techniques: Raman spectroscopy, photoluminescence spectroscopy, photoreflectance spectroscopy of the spots-image.

In example 30, the subject matter of any one or more of examples 28 to 29 may include, wherein each of the at least one light source is a single-frequency light source outputting ultraviolet (UV), near UV, visible (VIS), infrared (IR), or near IR (NIR) light of a narrow wavelength or frequency bandwidth.

In example 31, the subject matter of example 30, wherein the wavelength bandwidth of light outputted by each single-frequency light source is smaller than a bandwidth threshold ranging between 0-2 picometer (pm).

In example 32, the subject matter of any one or more of examples 28 to 31 may include, wherein the forming of the at least one multi-spot-array over the test area of the tested workpiece comprises:
selecting one light source from selectable multiple light sources, using a selection mechanism of the optical metrology system; and
controlling and adjusting position of the selected light source, in respect to other optical elements of the optical metrology system.

In example 33, the subject matter of any one or more of examples 28 to 32 may include, wherein the method may further comprise one or more of:
automatically placing of each tested workpiece over a movable support;
selecting a test area;
selecting required position of the tested workpiece over the movable support;
controlling the movable support for adjusting measuring-position of each tested workpiece.

In example 34, the subject matter of any one or more of examples 28 to 33 may include, wherein each multi-spot-array is arranged such that the light sports thereof are aligned in a row.

In example 35, the subject matter of any one or more of examples 28 to 34 may include, wherein each light spot of each multi-spot-array is of the same size and dimensions.

In example 36, the subject matter of any one or more of examples 28 to 34 may include, wherein each light spot of each multi-spot-array is of a different size, shape and/or dimensions.

In example 37, the subject matter of any one or more of examples 1 to 36 may include, wherein the at least one multi-spot-array is formed by using at least one lenslet array comprising multiple focusing micro-lenses, wherein light emanating from the at least one light source is passed through the at least one lenslet array.

In example 38, the subject matter of example 37 may include, wherein the at least one lenslet array comprises two lenslet arrays located parallelly to one another, wherein one of the two lenslet arrays is located at a pupil plane of the focusing micro-lens of the other lenslet array.

In example 39, the subject matter of example 37 may include, wherein the at least one lenslet array comprises a single lenslet array positioned at a non-zero distance from a pupil plane of the focusing lens creating different angles of incidence for each spot of the multi-spot-array formed over the tested workpiece, or over the pupil plan of the focusing lens creating the same angle of incidence (AOI) for each spot of the multi-spot-array formed over the tested workpiece.

In example 40, the subject matter of any one or more of examples 28 to 39 may include, wherein the maximum radius or length of each spot of the multi-spot-array is equal to or higher than a diffraction limit, which depends on the wavelength and bandwidth of the light source and optical elements being used and their relative positioning.

In example 41, the subject matter of any one or more of examples 28 to 40 may include, wherein the maximum size of the multi-spot-array is equal or lower than the test area size to fit entirely within the test area of the tested workpiece.

In example 42, the subject matter of any one or more of examples 28 to 40 may include, wherein the method further comprises at least:
controlling the illumination subsystem;
controlling measurements of workpieces properties by selection or allocation and operation of specific one or more executable acquisition programs for each workpiece type and required workpiece properties measurements being selected or determined;
receiving spectral output data from a spectrometry device of the optical metrology system;
analyzing the received spectral output data for each tested workpiece and each test area;
determining tested workpiece's test area properties, using one or more adjustable analysis programs;
controllably displaying information associated at least with analysis results, wherein the display is done via one or more local and/or remote output devices;
storing, in computer storage medium, at least the one or more adjustable analysis programs, accumulated received spectral output data for different workpieces, and/or control commands, protocols and/or programs.

In example 43, the subject matter of example 42 may include, wherein the method further comprises:
receiving input acquisition related information from one or more users via a user interface (UI) operable via a local or a remote device, the UI being configured to allow users to for defining various workpieces' acquisition parameter; and
controlling metrology of workpieces, also based on the input information.

In example 44, the subject matter of example 43 may include, wherein the input information comprises one or more of the following selectable input parameters: workpiece type, number of workpieces in each workpieces batch to be tested, one or more test areas to be tested in each workpiece, selected one or more operation wavelength/ frequency, acquisition duration per test area, wherein each different input parameters combination, selected by the user through the UI, is associated with a different executable acquisition program enabling automatic control of the testing of the entire selected batch of the same workpiece type to be tested.

In example 45, the subject matter of any one or more of examples 28 to 44 may include, being configured to form a plurality of multi-spot arrays over the test area of the tested workpiece, wherein metrology system is configured to form a wide aperture or a plurality of elongated apertures.

Although the above description discloses a limited number of exemplary embodiments of the invention, these embodiments should not apply any limitation to the scope of the invention, but rather be considered as exemplifications of some of the manners in which the invention can be implemented.

The method and/or processes described herein may be implemented by any one or more software, and/or hardware, element, apparatus, device, mechanism, electronic and/or digital computerized system, unit, processing module, device, machine, engine, etc.

The system, module, unit, device etc. or parts thereof, may be programmed to perform particular functions pursuant to computer readable and executable instructions, rules, conditions etc. from programmable hardware and/or software based execution modules that may implement one or more methods or processes disclosed herein, and therefore can, in effect, be considered as disclosing a "special purpose computer" particular to embodiments of each disclosed method/process.

Additionally or alternatively, the methods and/or processes disclosed herein may be implemented as a computer program that may be tangibly or intangibly embodied by a special purpose computer readable signal medium. A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a non-transitory computer or machine-readable storage device and that can communicate, propagate, or transport a program for use by or in connection with apparatuses, systems, platforms, methods, operations and/or processes discussed herein.

The terms "non-transitory computer-readable storage device" and "non-transitory machine-readable storage device" may also include distribution media, intermediate storage media, execution memory of a computer, and any other medium or device capable of storing for later reading by a computer program implementing embodiments of a method disclosed herein. A computer program product can be deployed to be executed on one computer or on multiple computers at one site or distributed across multiple sites and interconnected by one or more communication networks.

The computer readable and executable instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

A module, a device, a mechanism, a unit and or a subsystem may each comprise a machine or machines executable instructions (e.g. commands). A module may be embodied by a circuit or a controller programmed to cause the system to implement the method, process and/or operation as disclosed herein. For example, a module may be implemented as a hardware circuit comprising, e.g., custom very large-scale integration (VLSI) circuits or gate arrays, an Application-specific integrated circuit (ASIC), off-the-shelf semiconductors such as logic chips, transistors, and/or other discrete components. A module may also be implemented in programmable hardware devices such as field programmable gate arrays, programmable array logic, programmable logic devices and/or the like.

In the above disclosure, unless otherwise stated, terms such as "substantially", "about", approximately, etc., that specify a condition or relationship characterizing a feature or features of an embodiment of the invention, are to be understood to mean that the condition or characteristic is defined to within tolerances that are acceptable for operation of the embodiment for an application for which it is intended.

It is important to note that the methods/processes and/or systems/devices/subsystems/apparatuses etc., disclosed in the above Specification, are not to be limited strictly to flowcharts and/or diagrams provided in the Drawings. For example, a method may include additional or fewer processes or steps in comparison to what is described in the figures. In addition, embodiments of the method are not necessarily limited to the chronological order as illustrated and described herein.

It is noted that terms such as "processing", "computing", "calculating", "determining", "establishing", "analyzing", "checking", "estimating", "deriving", "selecting", "inferring", identifying", "detecting" and/or the like, may refer to operation(s) and/or process(es) of a computer, a computing platform, a computing system, or other electronic computing device(s), that manipulate and/or transform data represented as physical (e.g., electronic or optical signal) quantities within the computer's registers and/or memories into other data similarly represented as physical quantities within the computer's registers and/or memories or other information storage medium that may store instructions to perform operations and/or processes.

Terms used in the singular shall also include a plural scope, except where expressly otherwise stated or where the context otherwise requires.

In the description and claims of the present application, each of the verbs, "comprise" "include" and "have", and conjugates thereof, are used to indicate that the object or objects of the verb are not necessarily a complete listing of components, elements or parts of the subject or subjects of the verb.

Unless otherwise stated, the use of the expression "and/or" between the last two members of a list of options for selection indicates that a selection of one or more of the listed options is appropriate and may be made i.e. enabling all possible combinations of one or more of the specified options. Further, the use of the expression "and/or" may be used interchangeably with the expressions "at least one of the following", "any one of the following" or "one or more of the following", followed by a listing of the various options.

It is appreciated that certain features of the invention, which are, for clarity, described in the context of separate embodiments or example, may also be provided in combination in a single embodiment. Conversely, various features of the invention, which are, for brevity, described in the context of a single embodiment, example and/or option, may also be provided separately or in any suitable sub-combination or as suitable in any other described embodiment, example or option of the invention. Certain features described in the context of various embodiments, examples and/or optional implementation are not to be considered essential features of those embodiments, unless the embodiment, example and/or optional implementation is inoperative without those elements.

It is noted that the terms "in some embodiments", "according to some embodiments", "according to some embodiments of the invention", "for example", "e.g.", "for instance" and "optionally" may herein be used interchangeably.

The number of elements shown in the Figures should by no means be construed as limiting and is for illustrative purposes only.

It is noted that the terms "operable to" can encompass the meaning of the term "modified or configured to". In other words, a machine "operable to" perform a task can in some embodiments, embrace a mere capability (e.g., "modified") to perform the function and, in some other embodiments, a machine that is actually made (e.g., "configured") to perform the function.

Throughout this application, various embodiments may be presented in and/or relate to a range format. It should be understood that the description in range format is merely for convenience and brevity and should not be construed as an inflexible limitation on the scope of the embodiments. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals there between.

We claim:

1. A metrology system for measuring characteristics of workpieces, the metrology system comprising at least:
    a. an illumination subsystem comprising at least one light source;
    b. a workpiece handling subsystem configured at least for holding each tested workpiece to be measured at a specific required measuring-position;
    c. an optical subsystem configured and arranged to form at least one multi-spot-array, from light emanating from the at least one light source, over a test area of the tested workpiece;
    d. at least one spectrometry device having at least one aperture, positioned at a specific relative-position in respect to the test area of the tested workpiece, wherein the optical subsystem is further arranged and configured to direct light emanating from the multi-spot-array, onto the at least one aperture of the spectrometry device, for detecting spectral characteristics of one or more spots of the multi-spot-array;
    e. at least one processing and control unit (PCU), configured to receive spectral output data from the at least one spectrometry device to determine spectral characteristics of the one or more spots of the multi-spot-array, and determine one or more properties of the tested area of the tested workpiece, based on determined spectral characteristics of the one or more spots, wherein the distribution of energy density or flux of the at least one multi-spot-array over the test area of the tested workpiece is such that it prevents affecting the workpiece during its testing;
    wherein the optical subsystem comprises:
        at least one beam splitter for dividing light emanating from the at least one light source and reflecting light arriving from the tested workpiece;
        a collimator configured to collimate light beam emanating from the at least one light source;
        at least one lenslet array comprising an array of focusing micro-lenses located between the collimator and the tested workpiece, wherein the at least one lenslet array is positioned and configured to have collimated light manipulated to form the at least one multi-spot-array over the tested workpiece test area, and a focusing lens located between the at least one lenslet array and the tested workpiece;
        wherein the at least one lenslet array comprises two lenslet arrays located parallelly to one another, wherein one of the two lenslet arrays is located at a pupil plane of the micro-lenses of the other lenslet array.

2. The metrology system of claim 1, wherein the at least one spectrometry device is configured for using: Raman spectroscopy, photo luminescence and/or photoreflectance spectroscopy of the spots-image.

3. The metrology system of claim 1, wherein the optical subsystem is further arranged and configured to form a spots-image of the multi-spot-array, over the at least one aperture of the spectrometry device, for detecting spectral characteristics of each spot of the spots-image corresponding to the spots of the multi-spot-array, for determining characteristics of the workpiece.

4. The metrology system of claim 1, wherein the optical subsystem further comprises
    a first optical setup comprising one or more optical elements, configured and positioned to divide, direct and/or manipulate the light emanating form the at least one multi-spot-array over the test area, and
    a second optical setup comprising one or more optical elements, configured and positional to form a spots-image over the at least one aperture of the at least one spectrometry device;
    wherein the illumination each outputting light in a different wavelength; and
    a selection mechanism for selecting one light source and operating the selected light source;
    wherein the spectrometry device further comprises:
    a diffractive optical element (DOE); and
    a pixelated optical detector, located such that each spots-image projected onto the at least one aperture is diffracted, reflected and/or scattered by the DOE, and
    wherein light from the DOE is directed such as to be detected by the pixelated optical detector to form a pixelated spectral data of each spot of the multi-spot-array.

5. The metrology system of claim 4, wherein the DOE comprises a diffraction grating element.

6. The metrology system of claim 4, wherein the DOE is located such that an input surface of the DOE faces the at least one aperture of the spectrometry device.

7. The metrology system of claim 4, wherein the pixelated optical detector comprises any one of: charged coupled device (CCD), active pixel sensor (APS), pixelated RGB or RGBY camera.

8. The metrology system of claim 1, wherein each of the at least one light source is a single-frequency light source outputting ultraviolet (UV), near UV, visible (VIS), infrared (IR), or near IR (NIR) light of a narrow wavelength or frequency bandwidth.

9. The metrology system of claim 8, wherein the wavelength bandwidth of light outputted by each single-frequency light source is smaller than a bandwidth threshold ranging between 0-2 picometer (pm).

10. The metrology system of claim 1, wherein the illumination subsystem further comprises a positioning mechanism for controlling and adjusting position of the selected light source, in respect to other optical elements of the metrology system.

11. The metrology system of claim 1, wherein the workpiece handling subsystem, holding the tested workpiece comprises:

a movable support configured for holding the tested workpiece and for adjustably moving; and a sampling controller, configured for at least one of: automatic placing of each workpiece to be tested over the movable support, selecting test area, selecting positioning of the tested workpiece over the movable support and for controlling the movable support for adjusting measuring-position of each tested workpiece.

12. The metrology system of claim 1, wherein each multi-spot-array is arranged such that the light spots thereof are aligned in a row.

13. The metrology system of claim 1, wherein each light spot of each multi-spot-array is of the same size and dimensions.

14. The metrology system of claim 1, wherein the at least one aperture of the at least one spectrometry device has an elongated shape to receive therein or thereover, a spots-image aligned as at least one row emanating from the multi-spot-array.

* * * * *